(12) United States Patent
Matsumoto

(10) Patent No.: US 6,516,017 B1
(45) Date of Patent: Feb. 4, 2003

(54) MULTIWAVELENGTH SEMICONDUCTOR LASER DEVICE WITH SINGLE MODULATOR AND DRIVE METHOD THEREFOR

(75) Inventor: Keisuke Matsumoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/547,864

(22) Filed: Apr. 12, 2000

(30) Foreign Application Priority Data

Nov. 11, 1999 (JP) ............................... 11-321070

(51) Int. Cl.$^7$ ................................................ H01S 5/00
(52) U.S. Cl. .......................... 372/50; 372/26; 372/34; 372/43; 372/20
(58) Field of Search .......................... 372/50, 26, 96, 372/34, 11, 43, 20

(56) References Cited

U.S. PATENT DOCUMENTS

| | | | |
|---|---|---|---|
| 5,805,755 A | * | 9/1998 | Amersfoort et al. .......... 372/48 |
| 6,014,392 A | * | 1/2000 | Imai et al. .................... 372/26 |
| 6,198,757 B1 | * | 3/2001 | Broutin et al. ................ 372/26 |
| 6,275,317 B1 | * | 8/2001 | Doerr et al. ................. 359/124 |
| 6,341,025 B1 | * | 1/2002 | Mizrahi et al. ............. 359/130 |

OTHER PUBLICATIONS

Young et al., "Six-Channel WDM Transmitter Module With Ultra-Low Chirp and Stable λ Selection", Procedures of the 21st European Conference on Optical Communications, 1995, pp. 1019–1022.

Mason et al., "Widely Tunable Sampled Grating DBR Laser With Integrated Electroabsorption Modulator", IEEE Photonics Technology Letters, vol. 11, No. 6, Jun. 1999, pp. 638–640.

* cited by examiner

Primary Examiner—Quyen Leung
Assistant Examiner—Delma R. Flores Ruiz
(74) Attorney, Agent, or Firm—Leydig, Voit & Mayer, Ltd.

(57) ABSTRACT

A semiconductor laser device and corresponding drive method use a single modulator to attain, across a wide wavelength range of, for example, 12 nm or greater, the same wavelength difference Δλ between the oscillation wavelength of a distributed Feedback (DFB) laser diode and band gap wavelength, to attain a constant wavelength difference Δλ between the band gap wavelength of an optical modulator and one of the oscillation wavelengths of DFB laser diodes or a variable wavelength single laser device. This laser device applies an offset bias to the optical modulator and controls the temperature of a semiconductor laser chip.

15 Claims, 23 Drawing Sheets

| Channel No. | LD No. | λn[nm] | Tn[°C] |
|---|---|---|---|
| ① | LD1 | 1554.8 | 29.8 |
| ② | LD1 | 1554.0 | 21.8 |
| ③ | LD2 | 1553.2 | 28.2 |
| ④ | LD2 | 1552.4 | 20.2 |
| ⑤ | LD3 | 1551.6 | 26.6 |
| ⑥ | LD3 | 1550.8 | 18.6 |
| ⑦ | LD4 | 1550.0 | 25.0 |
| ⑧ | LD4 | 1549.2 | 17.0 |
| ⑨ | LD5 | 1548.4 | 23.4 |
| ⑩ | LD5 | 1547.6 | 15.4 |
| ⑪ | LD6 | 1546.8 | 21.8 |
| ⑫ | LD6 | 1546.0 | 13.8 |
| ⑬ | LD7 | 1545.2 | 20.2 |
| ⑭ | LD7 | 1544.4 | 12.2 |
| ⑮ | LD8 | 1543.6 | 18.6 |
| ⑯ | LD8 | 1542.8 | 10.6 |

Fig.7
| LDN | Oscil. wavelength at T1[nm] |
|---|---|
| LD1 | 1554.80 |
| LD2 | 1553.36 |
| LD3 | 1551.92 |
| LD4 | 1550.48 |
| LD5 | 1549.04 |
| LD6 | 1547.60 |
| LD7 | 1546.16 |
| LD8 | 1544.72 |
Fig.8A
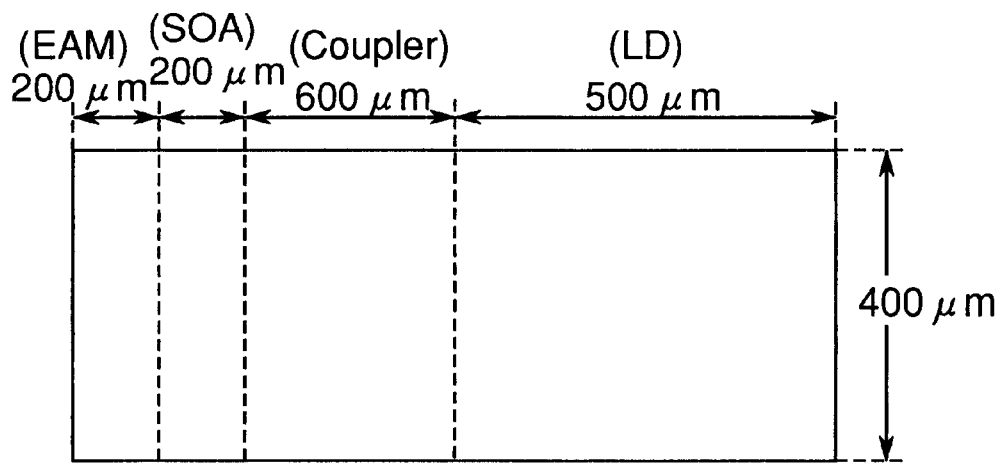
Fig.8B
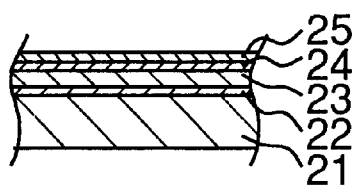

(EAM) (SOA) (Coupler) (LD)

(EAM) (SOA) (Coupler) (LD)

■ etched portion

■ aperture of insulation film

MULTIWAVELENGTH SEMICONDUCTOR LASER DEVICE WITH SINGLE MODULATOR AND DRIVE METHOD THEREFOR

BACKGROUND OF THE INVENTION

1. Field of the Invention

The present invention relates to an integrated external-modulator semiconductor laser device capable of operating at high speed for use in a transmitter for a wavelength multiplexed transmission system, and relates more specifically to such a semiconductor laser device selecting a plurality of wavelengths, and to a drive method for the semiconductor laser device.

2. Description of the Related Art

Wavelength-division multiplexing (WDM) techniques have been recently developed as a means of increasing the transmission capacity of fiber optic transmission paths. A particular benefit of WDM techniques is that the transmission capacity of existing fiber optic cables can be readily increased by several factors of ten. Semiconductor laser devices using an integrated modulator semiconductor laser, i.e., a semiconductor laser integrated with a modulator, have been developed as a light source for systems using WDM techniques. This type of semiconductor laser device dc drives a distributed feedback (DFB) laser diode and uses an electroabsorption modulator for high speed modulation of light emitted from the semiconductor laser.

The operating principle of an electroabsorption modulator is described briefly below.

The absorption layer of the electroabsorption modulator has either a multiquantum well or a strained multiquantum well structure. When a reverse field is applied to the absorption layer, the energy level of excitons (an electron and hole pair in a bound state) trapped inside the quantum well changes. This phenomenon is known as the quantum trapping Stark effect, and is illustrated in FIG. 31. The exciton causes a change in the absorption wavelength, which produces a change in light transmission. FIG. 32 illustrates exciton-induced change in absorption wavelength. As shown in FIG. 32, when there is a change in exciton energy level, the absorption wavelength of the exciton shifts to a longer wavelength. This effect is used for light modulation.

Referring to FIG. 32, if the oscillating wavelength of the laser is $\lambda$, absorption coefficient a of wavelength $\lambda$ changes $\Delta a$ depending on whether or not a reverse field is applied to the modulator. When a field is not applied, light passes the modulator, but when a reverse field is applied the modulator absorbs light from the laser. Considering exciton energy shift, it is also necessary to set the equivalent band gap wavelength of the modulator absorption layer to a shorter wavelength. A typical laser oscillation wavelength is approximately 1550 nm, and the corresponding band gap wavelength of the modulator absorption layer is approximately 1500 nm. The difference between these wavelengths, $\Delta\lambda$, is thus approximately 50 nm, and the equivalent band gap wavelength of the modulator absorption layer must therefore be set to a wavelength that is $\Delta\lambda$ shorter than the laser oscillation wavelength.

FIG. 33 is a typical view of an exemplary integrated modulator semiconductor laser device according to the related art. FIG. 34A shows the offset bias input to an optical modulator 102, and FIG. 34B shows the light output from the optical modulator 102. Referring to FIGS. 33, 34A, and 34B, it is to be noted that the optical modulator 102 and semiconductor laser 103 are monolithically integrated on semiconductor substrate 101, forming semiconductor laser chip 104. This chip 104 is affixed to metallic block 106 by way of intervening submount 105 of SiC or other material, and to metal package 108 by way of an intervening temperature control Peltier element 107 affixed to the opposite side of metallic block 106.

The Peltier element 107 is a solid cooling element that uses the Peltier effect commonly used for temperature control. The Peltier element 107 can be controlled to either heat or cool by changing the polarity of current flowing to the element 107. A thermistor (not shown in the figure) is used to detect the temperature of the semiconductor laser chip 104. Based on the temperature detected by this thermistor, the current flowing to the Peltier element 107 is controlled to maintain the semiconductor laser chip 104 at a desired temperature. The semiconductor laser 103 is driven to maintain a constant output by applying voltage to the semiconductor laser 103 in the forward direction.

The optical modulator 102 is driven by a high frequency square wave signal voltage. Light input to the optical modulator 102 from the semiconductor laser 103 is then modulated by the optical modulator 102 to a light wave output corresponding to the signal voltage. For example, when a normally 2- to 3-V reverse voltage is applied to the optical modulator 102, light is absorbed and laser beam emissions from the modulator 102 stop. A desirable offset voltage Voffset of typically less than 1 V, for example, may be applied in some cases to the optical modulator 102 when in a light transmitting state.

As the technology has progressed and the degree of wavelength multiplexing has increased, a new type of light source that does not use a single integrated modulator semiconductor laser to provide all wavelengths used by the WDM system has been needed. Examples of such light sources include a variable wavelength light source that uses a single semiconductor laser chip to output at multiple wavelengths, and an array of multiple wavelength semiconductor lasers integrated on a single chip. In addition to achieving a light source that could be used in a variety of systems, significant cost benefits could be obtained by providing many light sources in a single chip for use as a backup light source for a WDM transmission device. Such multiple wavelength light sources can also be used to route signals through a network using a wavelength routing technique by tuning laser output to a specific wavelength at different points in the network, and will be needed to build all types of optical networks in the future.

As a result, there has been much research into variable wavelength light sources using a single chip to output multiple wavelengths of light, as well as devices that integrate an array containing a plurality of semiconductor lasers of different wavelengths into a single light source chip, and integrate a modulator for each of the multiple light sources on this chip. For example, "Six-Channel WDM Transmitter Module with Ultra-Low Chirp and Stable $\lambda$ Selection," ECOC 1995 Th.B.3.4, from Lucent Technologies describes a device shown in FIG. 35. This device integrates an array of six semiconductor lasers, each producing a different wavelength at a 1.6 nm wavelength interval, with a coupler, semiconductor amplifier, and modulator. The semiconductor laser chip shown in FIG. 35 operates by selecting any one of the six output wavelengths.

As described above, the difference $\Delta\lambda$ between the oscillation wavelength of the semiconductor laser and the band gap wavelength of the optical modulator has a significant effect on the absorption characteristic of the optical modulator, and by extension has a significant effect on transmission characteristics at the oscillation wavelength of the semiconductor laser. The performance of the above-noted Lucent device when transmitting at 2.5 GHz over a 600 km path (Voffset=−1.5 V, 3.5 Vp-p) was evaluated using two wavelengths offset 3.2 nm. Minimum reception sensitivity at a bit error rate (BER) of 1e−9 was −31.2 dBm at 1559.71 nm and −30.4 dBm at 1556.49 nm, and its wavelength dependency is expected to be high.

The paper "Widely Tunable Sample Grating DBR Laser with Integrated Electroabsorption Modulator," published by UCSB (University of California, Santa Barbara) (PTL Vol. 11 No. 6, 1999, pp. 638–640) describes a device having a tunable sampled grating DBR laser capable of producing 51 different wavelengths at 0.8 nm intervals integrated with a modulator. As in the above device, the modulator uses a bulk active layer (band gap wavelength $\Delta g=1.43$ $\mu$m), and was evaluated for the wavelength dependence of the extinction ratio only. Wavelength dependence was shown to be quite high.

In order to modulate a wide range of wavelengths, a bulk absorption layer must be used in the modulator when a single electroabsorption modulator according to the related art is used to couple and modulate laser beams of multiple wavelengths. However, difference $\Delta\lambda$ varies with wavelength. even when such a bulk absorption layer is used, and it is difficult to achieve a device capable of operating across a wide wavelength range, particularly a wavelength range exceeding 12 nm, because of different transmission characteristics.

SUMMARY OF THE INVENTION

With consideration for the above mentioned problem, it is therefore an object of the present invention to provide a semiconductor laser device using an integrated modulator, multiwavelength semiconductor laser capable of modulation with the same wavelength difference $\Delta\lambda$ across a wide wavelength range, such as 12 nm or greater, using a single optical modulator.

It is a further object of the present invention to provide a drive method for this semiconductor laser device.

To achieve the object of the present invention, a semiconductor laser device according to a first preferred embodiment includes a laser unit having a plurality of single oscillation wavelength semiconductor lasers each having a different oscillation wavelength. An optical modulation unit has one electroabsorption modulator for optically modulating and externally emitting laser light from the laser unit. A coupling unit couples the laser unit and optical modulation unit so that laser light from each semiconductor laser is incident to the electroabsorption modulator. A temperature control unit controls the temperature of the laser unit and optical modulation unit by heating or cooling the respective unit. A laser selection unit selects and operates one of the plurality of semiconductor lasers in the laser unit. An offset bias control unit controls applying an offset bias to the electroabsorption modulator of the optical modulation unit. A controller specifies for the laser selection unit the semiconductor laser to be operated based on an external command, and controls operation of the temperature control unit and the offset bias control unit to attain a constant specified wavelength difference between the oscillation wavelength of the specified semiconductor laser and the band gap wavelength of the electroabsorption modulator.

This semiconductor laser device applies as needed an offset bias to the electroabsorption modulator, and controls the temperature of the laser unit and optical modulation unit so that the wavelength difference is the same between the band gap wavelength of the electroabsorption modulator and the wavelength emitted from the selected semiconductor laser. This makes it possible for a single modulator operating in a single state to modulate multiple laser output wavelengths selected from a wide wavelength range, such as 12 nm or greater.

Another version of the invention provides a semiconductor laser device including a laser unit having a single-wavelength semiconductor laser capable of oscillating at a plurality of different wavelengths. An optical modulation unit has one electroabsorption modulator for optically modulating and externally emitting laser light from the laser unit. A coupling unit couples the laser unit and optical modulation unit so that each laser output from the semiconductor laser is incident to the electroabsorption modulator. A temperature control unit controls the temperature of the laser unit and optical modulation unit by means of heating or cooling the respective unit. A wavelength selection and drive unit drives the semiconductor laser of the laser unit at a specific desired oscillation wavelength. An offset bias control unit controls applying an offset bias to the electroabsorption modulator of the optical modulation unit. A controller specifies for the wavelength selection and drive unit what oscillation wavelength the semiconductor laser is to be driven at based on an external command, and controls operation of the temperature control unit and the offset bias control unit to attain a constant specified wavelength difference between the specified oscillation wavelength and the band gap wavelength of the electroabsorption modulator.

This semiconductor laser device appropriately applies an offset bias to the electroabsorption modulator, and controls the temperature of the laser unit and optical modulation unit so that the wavelength difference is the same between the band gap wavelength of the electroabsorption modulator and the wavelength emitted from the variable oscillation wavelength semiconductor laser. This makes it possible for a single modulator operating in a single state to modulate multiple laser output wavelengths selected from a wide wavelength range, such as 12 nm or greater, even when a single variable wavelength semiconductor laser is used.

Whichever configuration is used, the laser unit, coupling unit and optical modulation unit are preferably integrated on a semiconductor substrate to form a semiconductor laser chip. In this case, the temperature control unit controls the temperature of the semiconductor laser chip. This makes it possible for a single modulator operating in a single state to modulate multiple laser output wavelengths selected from a wide wavelength range, such as 12 nm or greater, even when using a semiconductor laser chip.

It is alternatively possible for the laser unit, coupling unit and optical modulation unit to be packaged on the same substrate and form a hybrid integrated circuit. In this case, the temperature control unit controls the temperature of the hybrid integrated circuit. This makes it possible for a single modulator operating in a single state to modulate multiple laser output wavelengths selected from a wide wavelength range, such as 12 nm or greater, even when using a hybrid integrated circuit.

In a further alternative version of the present invention the laser unit, coupling unit and optical modulation unit are preferably discrete modules. In this case the temperature of each module is controlled by the temperature control unit. It is also possible with this configuration for a single modulator operating in a single state to modulate multiple laser output wavelengths selected from a wide wavelength range, such as 12 nm or greater. In addition, this semiconductor laser device can be used in an optical communications system using an optical transmitter.

Further preferably, the electroabsorption modulator of the optical modulation unit has a light absorption layer with a multiquantum well structure. When thus comprised, a single modulator operating in a single state can modulate multiple laser output wavelengths selected from a wide wavelength range, such as 12 nm or greater, without using a bulk active layer. The same benefit can also be achieved using a strained multiquantum well structure instead of this multiquantum well structure.

The invention is further directed to a semiconductor laser device drive method.

This drive method is used with the first semiconductor laser device described above according to the invention. This control method controls the temperature of the laser unit and optical modulation unit, and controls applying an offset bias to the electroabsorption modulator of the optical modulation unit, to attain a constant specified wavelength difference between the oscillation wavelength of a semiconductor laser in the laser unit and the band gap wavelength of the electroabsorption modulator.

By thus controlling the offset bias applied to the electroabsorption modulator and the temperatures of the laser unit and optical modulation unit so that the wavelength difference is the same between the band gap wavelength of the electroabsorption modulator and the oscillation wavelength of each semiconductor laser, a single modulator operating in a single state can modulate multiple laser output wavelengths selected from a wide wavelength range, such as 12 nm or greater.

A semiconductor laser device drive method according to another version of the invention is used with the second semiconductor laser device described above according to the present invention. This control method controls the temperature of the laser unit and the optical modulation unit, and controls applying an offset bias to the electroabsorption modulator of the optical modulation unit, to attain a constant specified wavelength difference between the oscillation wavelength of the semiconductor laser in the laser unit and the band gap wavelength of the electroabsorption modulator.

By thus controlling the temperature of the variable single-wavelength semiconductor laser and the electroabsorption modulator, and controlling the offset bias applied to the electroabsorption modulator so that a constant specified wavelength difference is maintained between the oscillation wavelength of the variable single-wavelength semiconductor laser and the band gap wavelength of the electroabsorption modulator, a single modulator operating in a single state can modulate multiple laser output wavelengths selected from a wide wavelength range, such as 12 nm or greater, even using a variable single-wavelength semiconductor laser.

BRIEF DESCRIPTION OF THE DRAWINGS

Other objects and attainments together with a fuller understanding of the invention will become apparent and appreciated by referring to the following description and claims taken in conjunction with the accompanying drawings where:

FIG. 7 is table of the calculated oscillation wavelengths of DFB laser diodes LD1 to LD8 at temperature T1;

FIGS. 8A and 8B are a plan view and side section view, respectively, of a step in a process for manufacturing the semiconductor laser chip shown in FIG. 1;

DESCRIPTION OF THE PREFERRED EMBODIMENTS

Preferred embodiments of the present invention are described below with reference to the accompanying figures.

Embodiment 1

Figure 1:
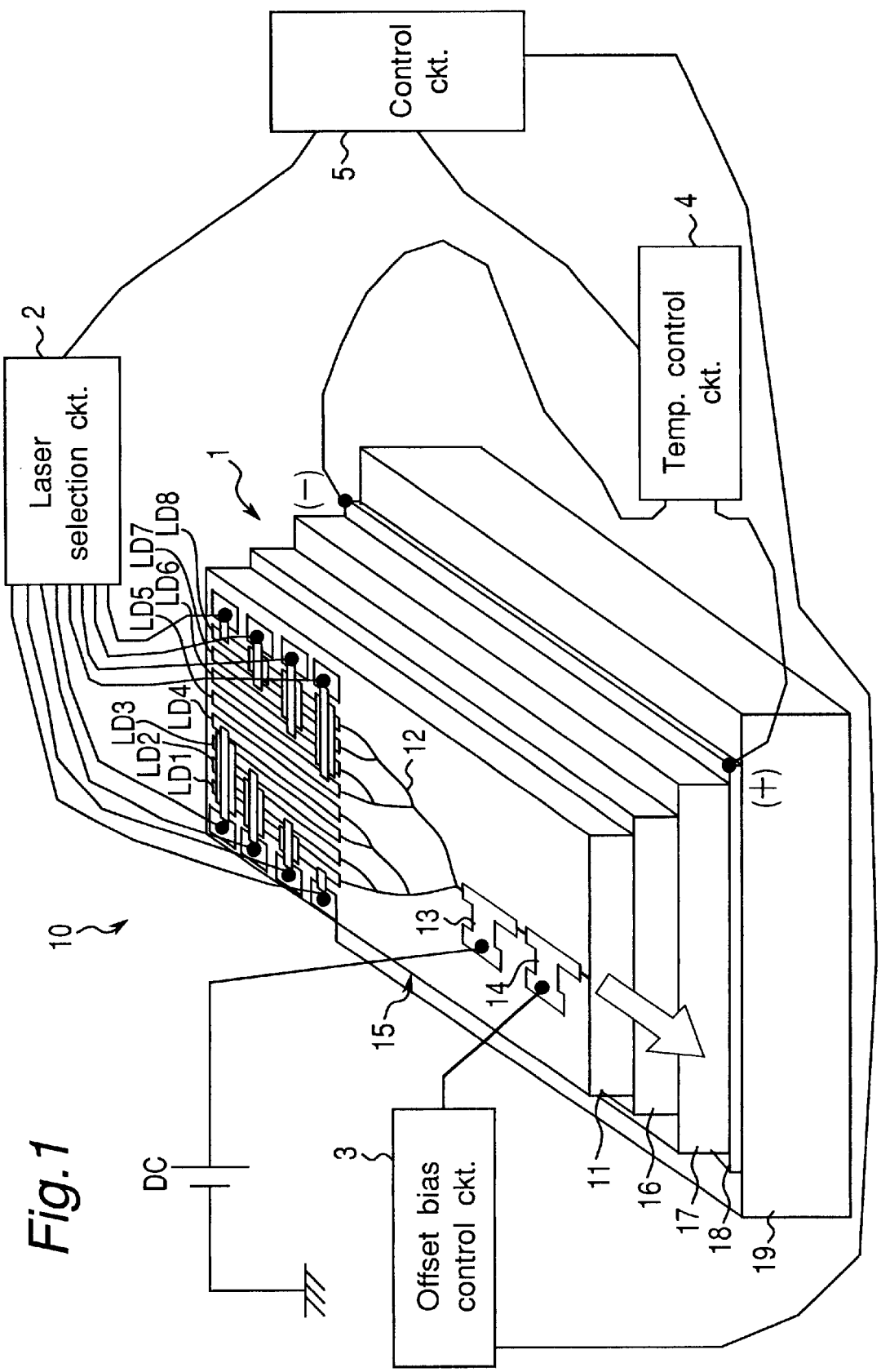
FIG. 1 shows a typical configuration of a semiconductor laser device according to a first preferred embodiment of the present invention.

FIG. 1 is a typical view of a semiconductor laser device according to a first preferred embodiment of the present invention. It will be known from FIG. 1 that this exemplary semiconductor laser device includes eight semiconductor laser diodes each emitting a different wavelength.

A semiconductor laser device 10 as shown in FIG. 1 comprises an integrated modulator semiconductor laser 1 having a modulator and a plurality of distributed feedback lasers (DFB lasers below) each having a different oscillation wavelength; a laser selection circuit 2 for selecting and supplying power to one of the plural DFB lasers of the integrated modulator semiconductor laser 1; an offset bias control circuit 3 for controlling offset bias applied to the optical modulator of the integrated modulator semiconductor laser 1; a temperature control circuit 4 for controlling the temperature of semiconductor laser 1; and a control circuit 5 for controlling operation of laser selection circuit 2, offset bias control circuit 3, and temperature control circuit 4.

The integrated modulator semiconductor laser 1 comprises a semiconductor laser chip 15 on a semiconductor substrate 11. The semiconductor laser chip 15 is achieved by monolithically integrating eight DFB laser diodes LD1 to LD8; a coupler 12 comprising branched waveguides and includes a semiconductor optical amplifier 13 for amplifying laser beams input thereto by way of the coupler 12; and an optical modulator 14, which in this case is an electroabsorption modulator. The DFB laser diodes LD1 to LD8 oscillate at different wavelengths $\lambda 1$ to $\lambda 8$, and form, for example, a $\lambda/4$ shift DFB laser array. A forward voltage is applied to the DFB laser diodes LD1 to LD8 to drive them at a constant output level. A forward voltage is also applied to the optical amplifier 13 for light amplification.

Light amplified by the optical amplifier 13 is driven by the optical modulator 14 using a high frequency square wave signal voltage, and is thus modulated according to the square wave signal voltage. When a reverse voltage is applied and the optical modulator 14 is in an on state in which the modulator passes light, a desired offset bias voltage Voffset of typically 1 V or less may be applied in some cases. Applying a reverse voltage of normally 2 V to 3 V, for example, switches the optical modulator 14 to an off state in which light is absorbed.

A Peltier cooler 18 affixed to metallic package 19 is disposed to the back side of the semiconductor laser chip 15 by way of intervening submount 16, which is typically SiC, and metal block 17. The Peltier cooler 18 is for adjusting the temperature of semiconductor laser chip 15.

The Peltier cooler 18 is a solid cooling element that uses the Peltier effect, and can be controlled to either heat or cool by changing the polarity of current flowing to the cooler 18. The Peltier cooler 18 can thus be used to maintain all elements on the semiconductor substrate 11 at the same temperature. A thermistor or other temperature sensor (not shown in the figure) is used to detect this temperature.

The DFB laser diodes LD1 to LD8 are connected to the laser selection circuit 2, and the optical modulator 14 is connected to the offset bias control circuit 3, in this integrated modulator semiconductor laser 1. In addition, the positive and negative electrodes of the Peltier cooler 18 are connected to the temperature control circuit 4, the optical modulator 14 is connected to the offset bias control circuit 3, and the optical amplifier 13 is connected to dc source DC. The laser selection circuit 2 is connected to the offset bias control circuit 3, and the temperature control circuit 4 is connected to the control circuit 5.

Thus comprised, the control circuit 5 tells the laser selection circuit 2 which of the DFB laser diodes LD1 to LD8 operates at the wavelength closest to an externally specified emission wavelength based on predefined data. The control circuit 5 also tells the offset bias control circuit 3 whether there is an offset bias to apply, and specifies a temperature for the temperature control circuit 4.

How a semiconductor laser device 10 according to this first preferred embodiment of the present invention obtains laser light of, for example, two different wavelengths from a single DFB laser by changing the temperature is described next.

In this case the offset bias control circuit 3 controls whether a specific offset bias is applied to the optical modulator 14 based on the above-noted command from control circuit 5. It should also be noted that when laserlight of three different wavelengths are obtained by changing the temperature of a single DFB laser, the offset bias applied to the optical modulator 14 is changed to one of three bias voltages, such as 0 V, 0.3 V, and 0.6 V. It will thus be obvious that the number of offset bias voltages applied to the optical modulator 14 is determined by the number of wavelengths to be obtained from a single DFB laser.

The laser selection circuit 2 supplies current to the one DFB laser diode LD1 to LD8 specified by the control circuit 5 to drive the selected DFB laser. Light from the DFB laser to which current is applied by the laser selection circuit 2 passes coupler 12, is amplified by the optical amplifier 13, and then optically modulated by the optical modulator 14 before being emitted from the semiconductor laser 1.

The offset bias control circuit 3 applies an offset bias at the voltage specified by the control circuit 5 to the optical modulator 14. The temperature control circuit 4 controls the current supplied to the Peltier cooler 18 to maintain the temperature of the semiconductor laser chip 15 at the temperature specified by the control circuit 5.

The preset offset bias values passed to the optical modulator 14 by the control circuit 5, and the method of calculating the temperature of the semiconductor laser chip 15, are described next.

A difference in propagation characteristics occurs depending upon the wavelength of the desired laser light because the wavelength difference Δλ changes according to the wavelength of the desired laser light. It will be remembered that difference Δλ is the difference between the oscillation wavelength of the DFB laser, and the band gap wavelength of the optical modulator 14. As a result, the offset bias applied to the optical modulator 14 and the temperature of the semiconductor laser chip 15 are calculated so that the wavelength difference Δλ remains the same at any externally specified wavelength.

Figure 2:
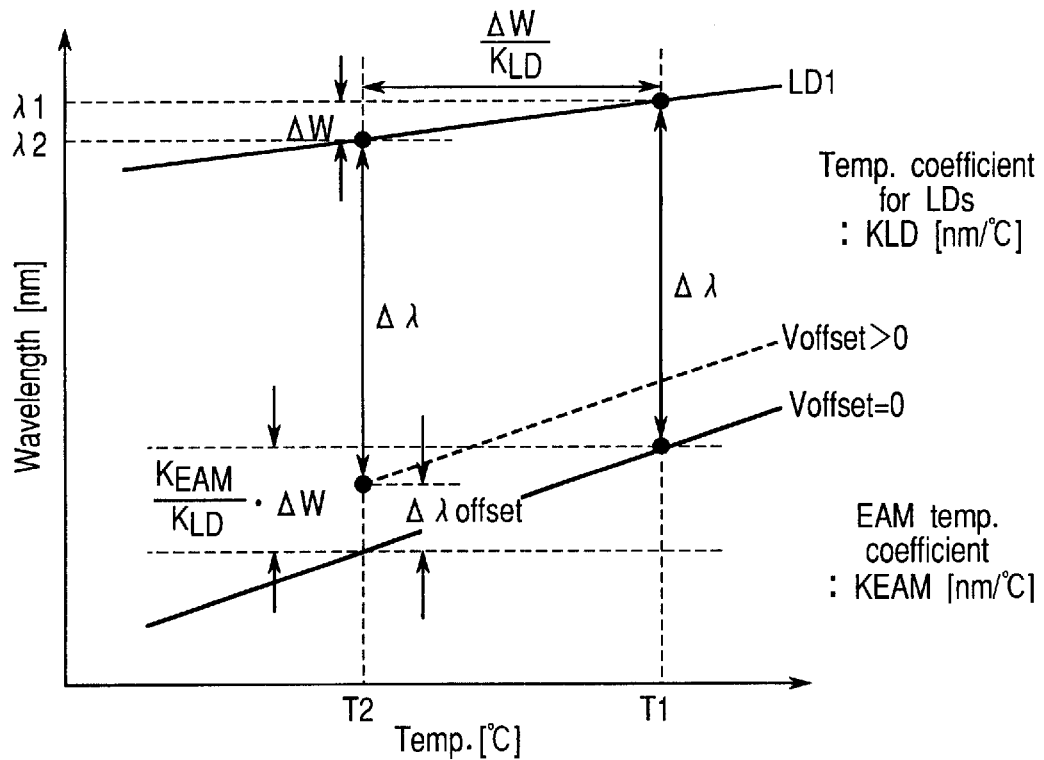
FIG. 2 is a graph showing the relationship between temperature and the oscillation wavelength of a DFB laser and the band gap wavelength of an optical modulator.

FIG. 2 shows the relationship between DFB laser diode oscillation wavelength and the temperature of semiconductor laser chip 15 obtaining a particular band gap wavelength in optical modulator 14. More specifically, FIG. 2 shows the relationship between wavelength difference Δλ and the offset bias voltage Voffset applied to optical modulator 14 when DFB laser diode LD1 is used at two wavelengths λ1 and λ2, which differ by ΔW.

In FIG. 2, DFB laser diode LD1 operates at oscillation wavelength λ1 at temperature T1, and at λ2 at temperature T2 (T2<T1). The temperature coefficient $K_{LD}$ (nm/°C.) for the oscillation wavelengths of DFB laser diodes LD1 to LD8, and the temperature coefficient $K_{EAM}$ (nm/°C.) for the band gap wavelength of the optical modulator 14 are specific, experimentally determined values, and wavelength differences Δλ are experimentally determined values optimized for the construction of the DFB laser diodes LD1 to LD8 and optical modulator 14. Oscillation wavelengths λ1 and λ2 are also preferably used at the same wavelength difference Δλ, λ1 being the maximum wavelength design value at each oscillation wavelength of DFB laser diodes LD1 to LD8, and temperature T1 being the maximum usable temperature design value of the semiconductor laser chip 15. Difference ΔW is the specific wavelength interval design value between channels in each DFB laser diode LD1 to LD8.

Oscillation wavelength λ2 and temperature T2 are first calculated based on oscillation wavelength λ1 and temperature T1. Oscillation wavelength λ2 is obtained from equation 1 using channel wavelength difference ΔW.

$$\lambda 2=\lambda 1-\Delta W \quad (1)$$

Temperature T2 is obtained from equation 2 based on the relationship of temperature coefficient $K_{LD}$ to the oscillation wavelength of DFB laser diode LD1.

$$T2=T1-\Delta W/K_{LD} \quad (2)$$

If oscillation wavelength λ1 is used with a 0-V offset bias applied to the optical modulator 14, offset bias voltage Voffset must be applied to optical modulator 14 to obtain the same wavelength difference Δλ as when laser light of oscillation wavelength λ2 is used. If the change in wavelength difference Δλ when offset bias voltage Voffset is applied is Δλoffset, Δλoffset can be obtained using equation 3 considering band gap wavelength temperature coefficient $K_{EAM}$ of optical modulator 14.

$$\Delta \lambda \text{offset}=\Delta W \times (K_{EAM}/K_{LD}-1) \quad (3)$$

Next, the oscillation wavelength of DFB laser diode LD2 at temperature T3 is set to λ3, and laser light of oscillation wavelength λ3 is used when an offset bias of 0 V is applied.

Figure 3:
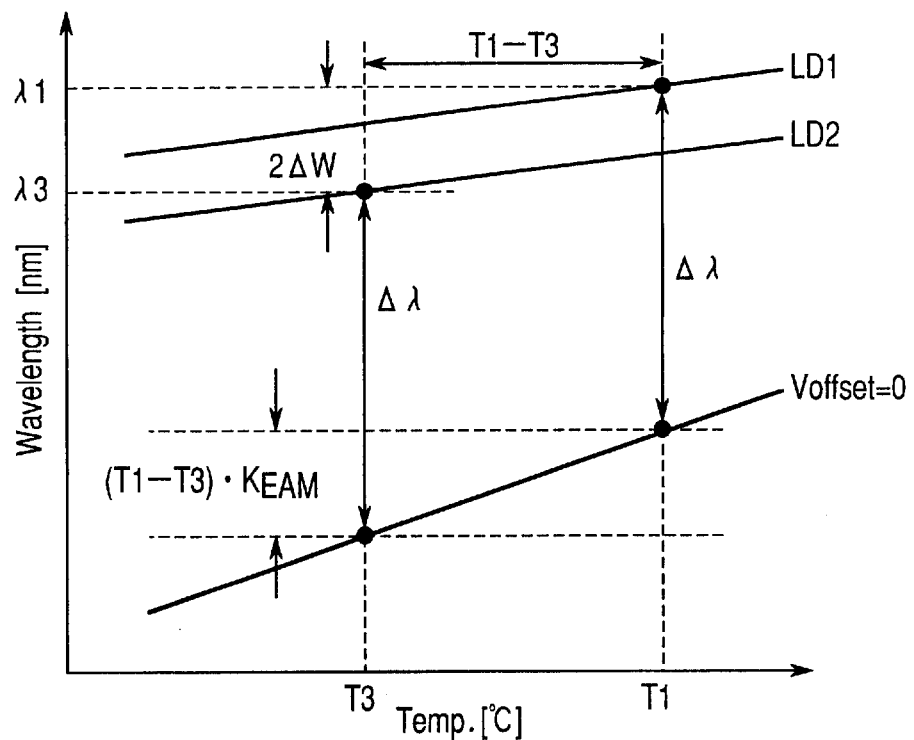
FIG. 3 is another graph showing the relationship between temperature and the oscillation wavelength of a DFB laser and the band gap wavelength of an optical modulator.

FIG. 3 shows the relationship between wavelength difference Δλ and the offset bias voltage Voffset applied to optical modulator 14 using, by way of example, DFB laser diodes LD1 and LD2 to output two wavelengths λ1 and λ3. As shown in FIG. 3, wavelength λ3 can be obtained from equation 4.

$$\lambda 3=\lambda 2-\Delta W=\lambda 1-2\Delta W \quad (4)$$

Considering band gap wavelength temperature coefficient $K_{EAM}$ of optical modulator 14, temperature T3 can be obtained from equation 5.

$$T3=T1-2\Delta W/K_{EAM} \quad (5)$$

It will thus be obvious that generalized equations can be used to calculate the oscillation wavelengths of DFB laser diodes LD1 to LD8 and the corresponding temperature of semiconductor laser chip 15 as shown below.

Laser oscillation wavelength λn and temperature Tn of the semiconductor laser chip 15 for any oscillation wavelength λn can be calculated using the general equations 6 to 8 below where n is a natural number from 1 to 16.

$$\lambda n=\lambda 1-(n-1)\Delta W \quad (6)$$

If n is odd:

$$Tn=T1-(n-1)\Delta W/K_{EAM} \quad (7)$$

If n is even:

$$Tn=T1-(n-2)\Delta W/K_{EAM}-\Delta W/K_{LD} \quad (8)$$

The temperature of the semiconductor laser-chip 15 specified by the control circuit 5 to the temperature control circuit 4 is thus determined using equations 7 and 8. When the lower of the two wavelengths at which a particular DFB laser diode can operate is used, the offset bias control circuit 3 is instructed to apply the offset bias to optical modulator 14.

Figure 4:
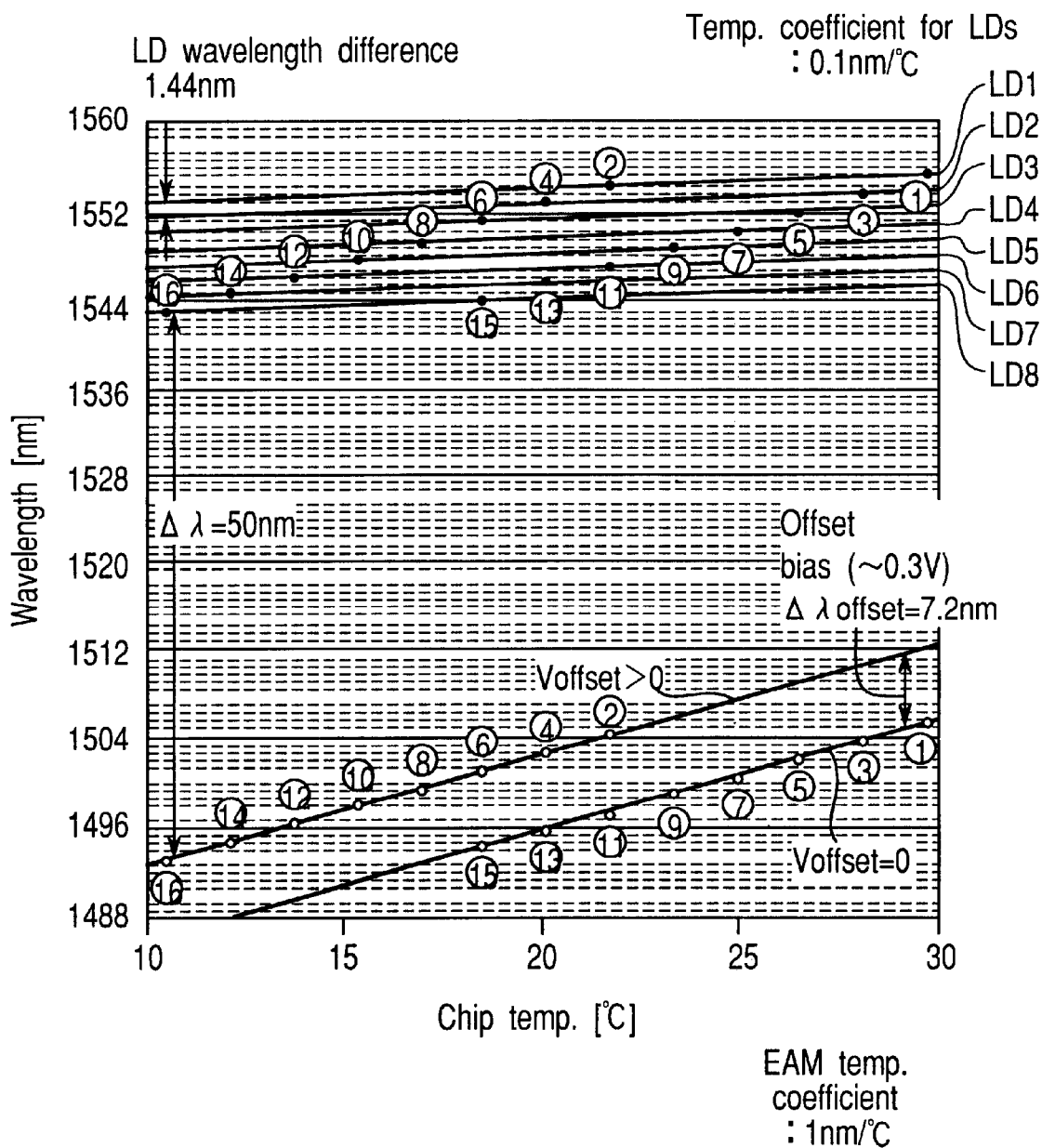
FIG. 4 is a graph showing the relationship between chip temperature and the oscillation wavelength of each DFB laser in FIG. 1.
Figures 5, 6:
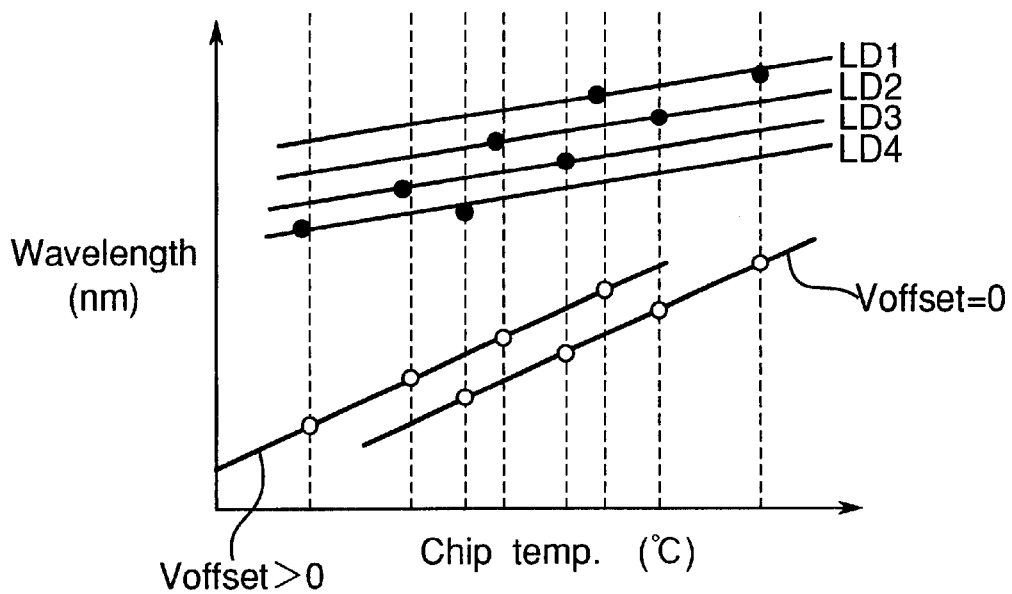
FIG. 5 is a table showing the relationship between chip temperature and the oscillation wavelength of each DFB laser in FIG. 1.
FIG. 6 is a graph showing the relationship between chip temperature and the oscillation wavelength of each DFB laser in FIG. 1.

For example, if $K_{LD}$=0.1 nm/°C., $K_{EAM}$=1.0 nm/°C., Δλ=50 nm, λ1=1554.8 nm, T1=29.8° C., and ΔW=0.8 nm, the sixteen channel wavelengths and temperature settings for semiconductor laser chip 15 will be as shown in FIG. 4 and FIG. 5. From equation 3 above, Δλoffset=7.2 nm, which is equivalent to an offset bias voltage of approximately 0.3 V. It is to be noted that the above-noted index n indicates a channel number as shown in FIG. 5. For example, if the wavelength input from the external source is 1552.4 nm, control circuit 5 specifies DFB laser diode LD2 for laser selection circuit 2, instructs the offset bias control circuit 3 to apply the offset bias voltage, and sets the control temperature of temperature control circuit 4 to 20.2° C.

It is to be noted that while the temperature is the same for channels 2 and 11, channels 4 and 13, and channels 6 and 15, these can be considered special cases where $K_{EAM}/K_{LD}$=10 or an integer multiple thereof. It is also possible as shown in FIG. 6 to define a different temperature and offset voltage combination for every channel wavelength. Note that DFB laser diodes LD5 to LD8 are omitted from FIG. 6.

To form DFB laser diodes LD1 to LD8, the oscillation wavelength λN(T1) at temperature T1 is next calculated for DFB laser diodes LD1 to LD8. Note that index N is the number of the DFB laser, and in this exemplary embodiment is a value from 1 to 8.

The condition for not applying the offset bias to DFB laser diodes LD1 to LD8 is when n is odd, and can therefore be expressed as n=2N−1. The oscillation wavelength λN(Tn) at a temperature Tn for DFB laser diode LDN can therefore be derived from equation 6 as shown in equation 9. Note that equation 9 applies to temperature Tn obtained with equation 7 above.

$$\lambda N(Tn)=\lambda 1-2(N-1)\Delta W \quad (9)$$

From equation 7, we get $$Tn=T1-2(N-1)\Delta W/K_{EAM} \quad (10)$$

and using equation 10, the temperature difference to temperature T1 is $$T1-Tn=2(N-1)\Delta W/K_{EAM} \quad (11)$$

The difference from the wavelength at temperature T1 is therefore $$\lambda 1(T1)-\lambda N(Tn)=2\Delta W(N-1)K_{LD}/K_{EAM} \quad (12)$$

Note that $\lambda 1(T1)=\lambda 1$. Therefore, from equations 9 and 12, $$\lambda N(T1)=\lambda 1-2(N-1)\Delta W-2\Delta W(N-1)K_{LD}/K_{EAM}=\lambda 1-2(N-1)\Delta W(1-K_{LD}/K_{EAM}) \quad (13)$$

Exemplary calculations of oscillation wavelengths $\lambda N(T1)$ at temperature T1 for DFB laser diodes LD1 to LD8 are shown in FIG. 7. For the example shown in FIG. 7, DFB laser diodes LD1 to LD8 are made so that the wavelength interval is 1.44 nm at the same temperature T1 of 29.8° C.

A method of manufacturing semiconductor laser chip 15 shown in FIG. 1 is shown in FIG. 8 to FIG. 24, and is described below with reference to these figures. It should be noted that in these figures the part at which DFB laser diodes LD1 to LD8 are formed is referred to as the LD part, the part where coupler 12 is formed is referred to as the coupler part, that of the optical amplifier 13 as the SOA part, and that of the optical modulator 14 as the EAM part. The steps in this manufacturing process proceed sequentially from FIG. 8 to FIG. 24. FIGS. 8A to 16A, FIG. 17, and FIGS. 18A to 24A show plan views. FIG. 8B is a partial section view of FIG. 8A, and FIGS. 19B to 16B and 18B to 24B are section views corresponding to the plan views in the same figures.

As shown in FIG. 8, the first step is to grow over the entire surface of n-InP substrate 21, which is n-type semiconductor substrate 11: LD part active layer (strained MQW structure) 22, which has a total layer thickness of approximately 0.2 μm, including an n-InP clad layer; a p-InP clad layer 23 with a film thickness of approximately 0.2 μm; p-InGaAsP diffraction grating layer 24 with a film thickness of approximately 40 nm; and p-InP gap layer 25 with a film thickness of approximately 5 nm.

Figure 9A:
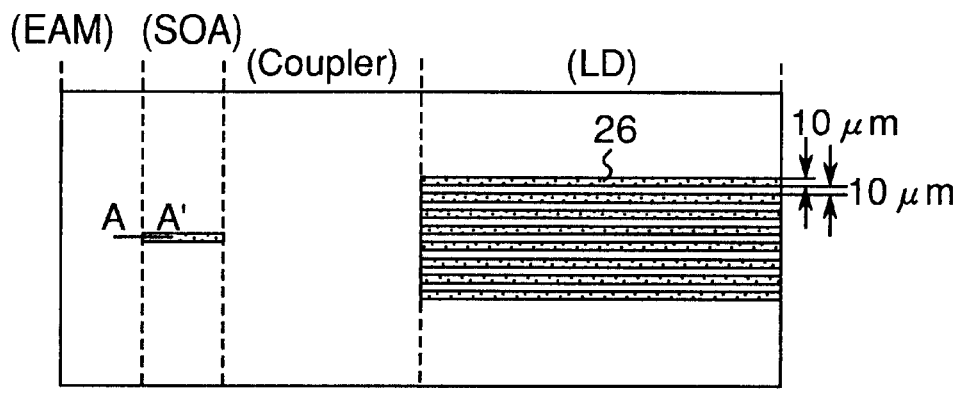
FIGS. 9A and 9B are a plan view and side section view, respectively, of a step in a process for manufacturing the semiconductor laser chip shown in FIG. 1.
Figure 9B:
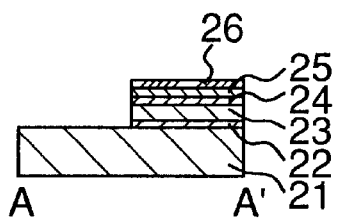
Figure 10A:
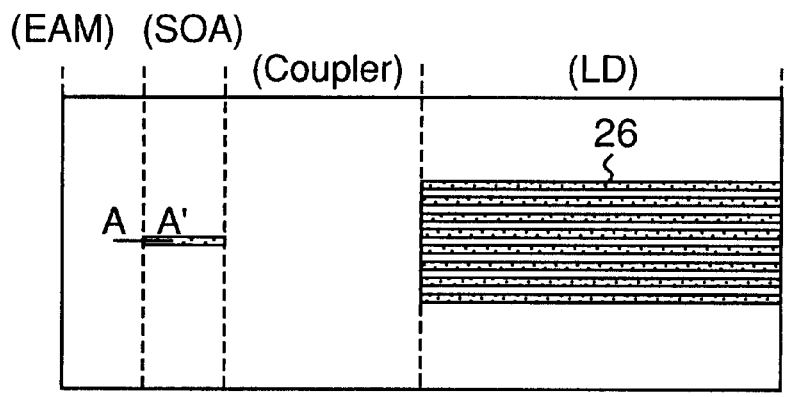
FIGS. 10A and 10B are a plan view and side section view, respectively, of a step in a process for manufacturing the semiconductor laser chip shown in FIG. 1.
Figure 10B:
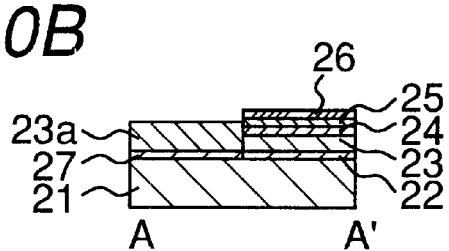
Figure 11A:
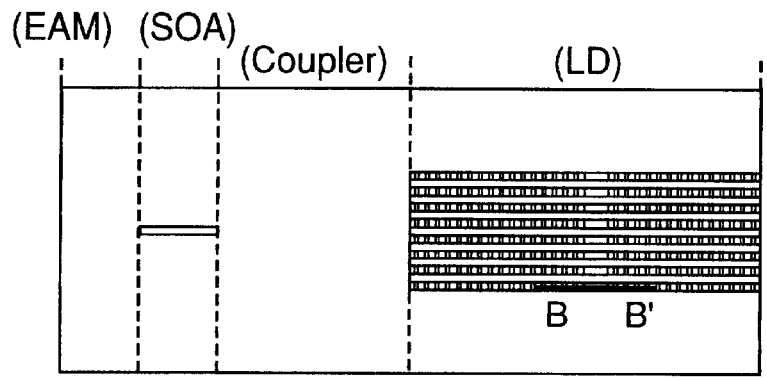
FIGS. 11A and 11B are a plan view and side section view, respectively, of a step in a process for manufacturing the semiconductor laser chip shown in FIG. 1.
Figure 11B:
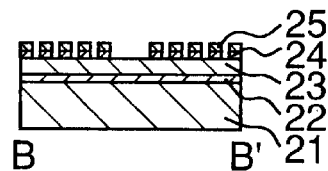

Next, as shown in FIG. 9, the LD part and SOA part are masked with an insulation film 26 and etched to remove LD part active layer 22, p-InP clad layer 23, p-InGaAsP diffraction grating layer 24, and p-InP gap layer 25. An EAM part absorption layer 27 with a total layer thickness of approximately 0.2 μm, and a p-InP clad layer 23a approximately 0.2 μm thick are then selectively grown as shown in FIG. 10, and the diffraction grating layer 24 is etched at a regular interval to form a diffraction grating in the LD part.

Figure 12A:
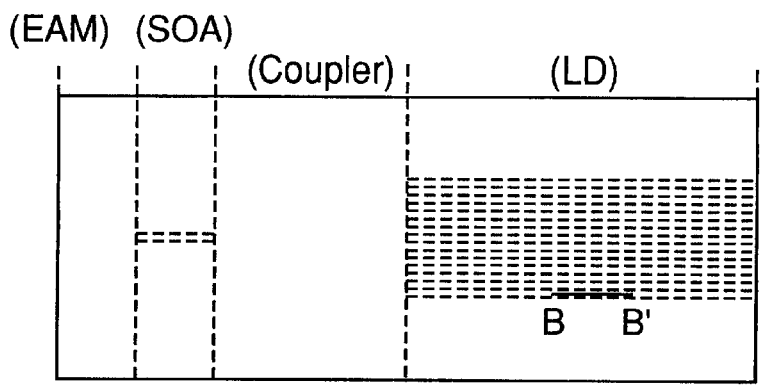
FIGS. 12A and 12B are a plan view and side section view, respectively, of a step in a process for manufacturing the semiconductor laser chip shown in FIG. 1.
Figure 12B:
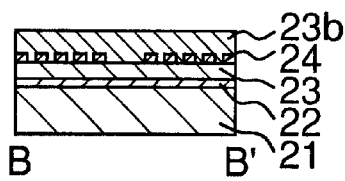
Figure 13A:
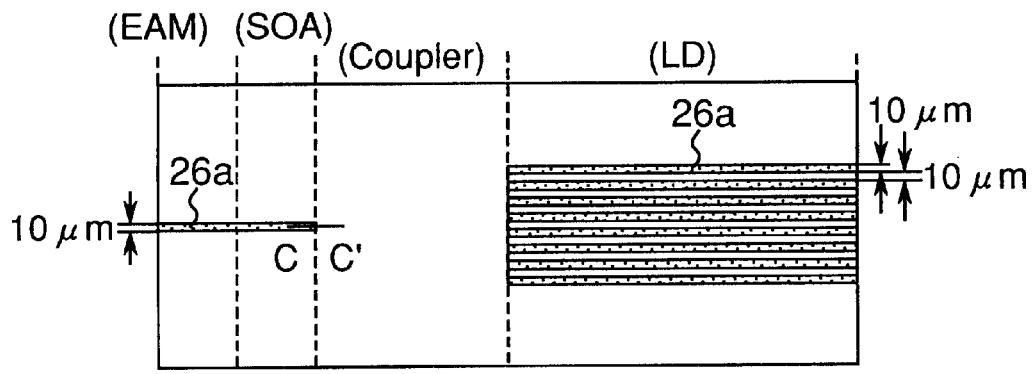
FIGS. 13A and 13B are a plan view and side section view, respectively, of a step in a process for manufacturing the semiconductor laser chip shown in FIG. 1.
Figure 13B:
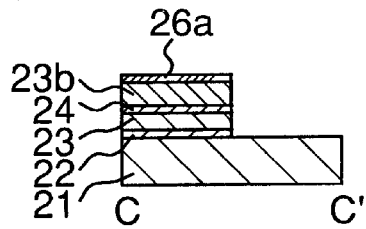
Figure 14A:
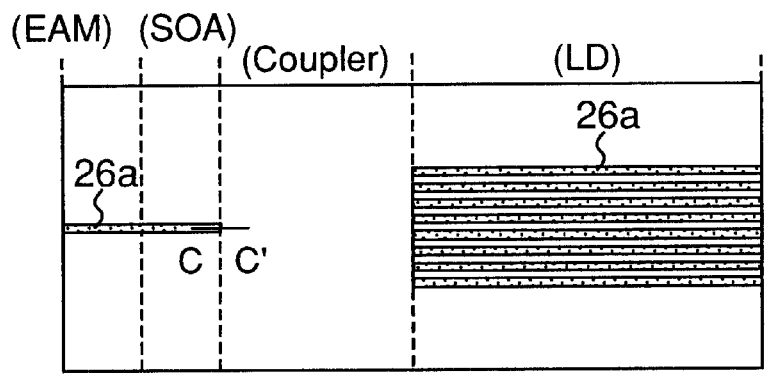
FIGS. 14A and 14B are a plan view and side section view, respectively, of a step in a process for manufacturing the semiconductor laser chip shown in FIG. 1.
Figure 14B:
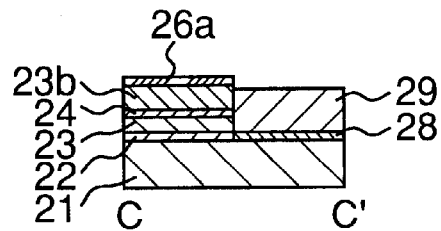

An approximately 0.7 μm thick p-InP clad layer 23b is then grown over the entire surface as shown in FIG. 12. The LD part, SOA part, and EAM part are then masked with insulation film 26a and etched as shown in FIG. 13 to remove the EAM part absorption layer 27 and p-InP clad layer 23a grown in the coupler part. An undoped InGaAsP waveguide layer 28 approximately 0.2 μm thick, and undoped p-InP layer 29 approximately 0.7 μm thick, are then selectively grown as shown in FIG. 14.

Figure 15A:
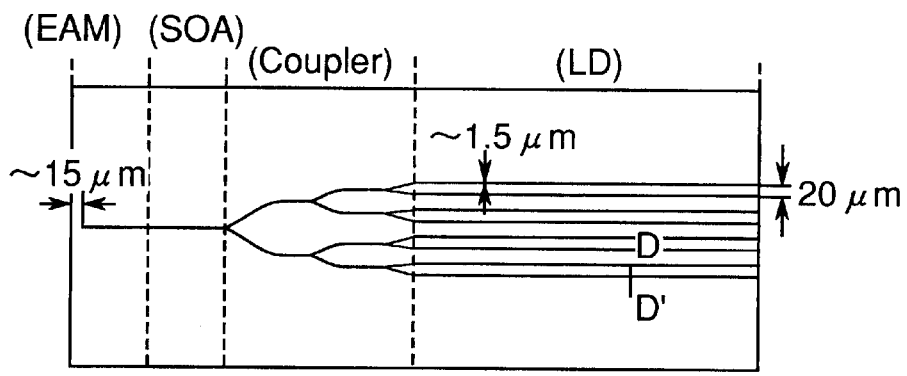
FIGS. 15A and 15B are a plan view and side section view, respectively, of a step in a process for manufacturing the semiconductor laser chip shown in FIG. 1.
Figure 15B:
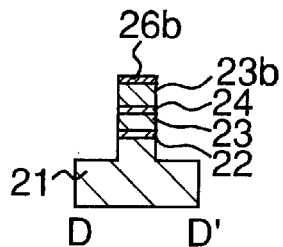
Figure 16A:
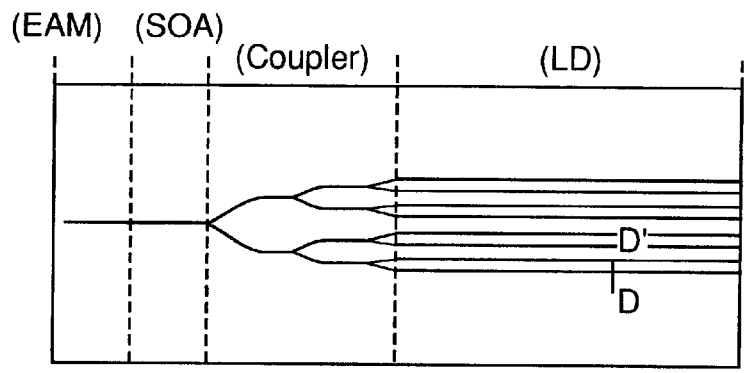
FIGS. 16A and 16B are a plan view and side section view, respectively, of a step in a process for manufacturing the semiconductor laser chip shown in FIG. 1.
Figure 16B:
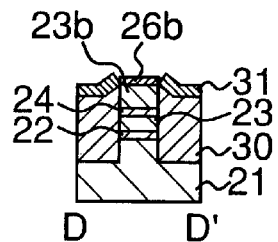
Figure 17:
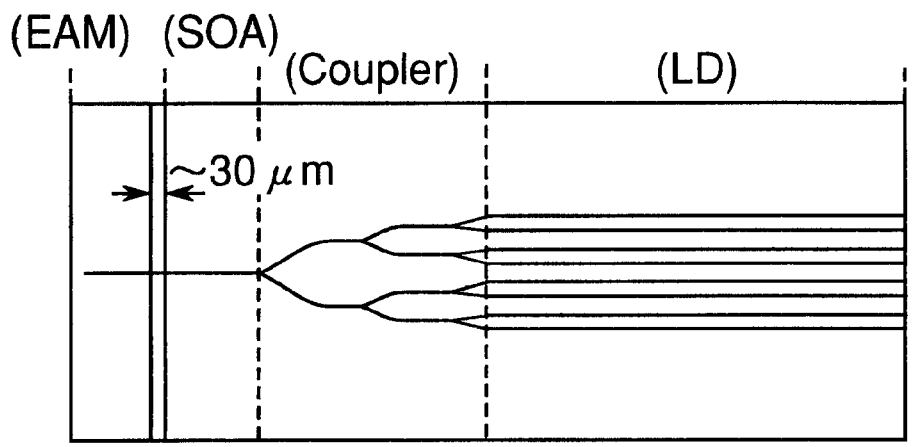
FIG. 17 is a plan view of a step in a process for manufacturing the semiconductor laser chip shown in FIG. 1.
Figure 18A:
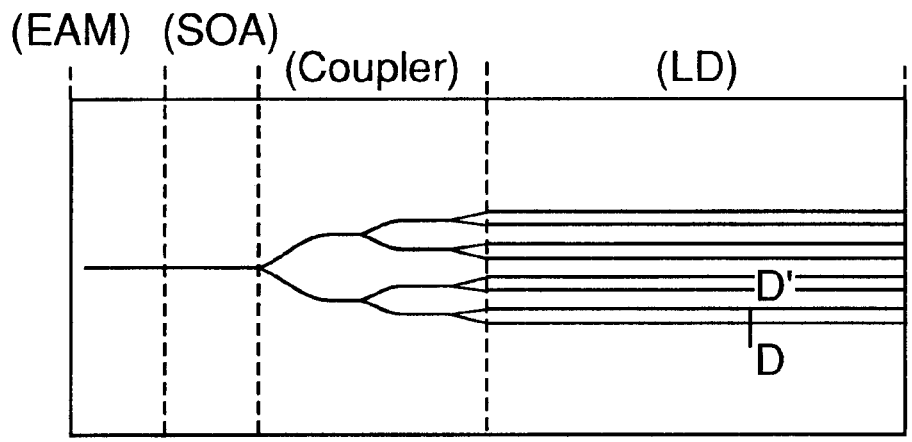
FIGS. 18A and 18B are a plan view and side section view, respectively, of a step in a process for manufacturing the semiconductor laser chip shown in FIG. 1.
Figure 18B:
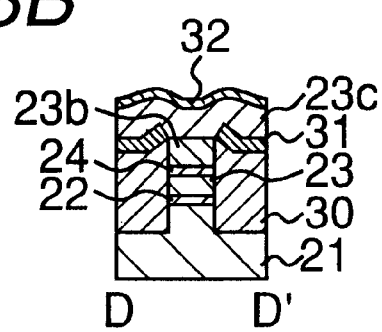
Figure 19A:
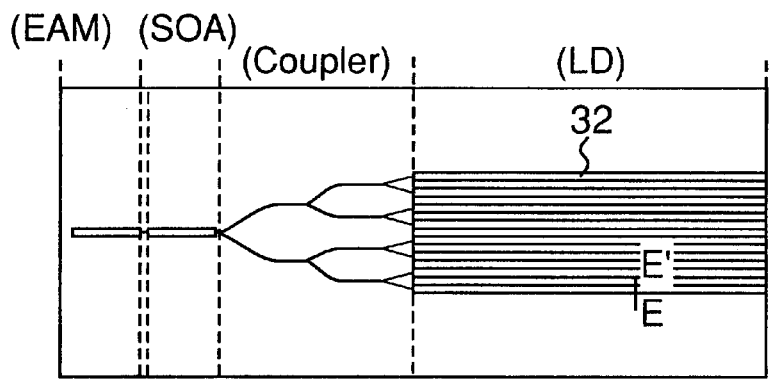
FIGS. 19A and 19B are a plan view and side section view, respectively, of a step in a process for manufacturing the semiconductor laser chip shown in FIG. 1.
Figure 19B:
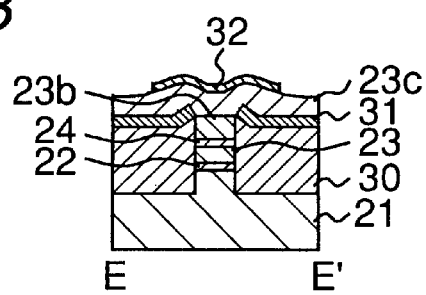

Using insulation mask 26b, waveguide ridges approximately 1.5 μm wide and approximately 3.5 μm deep are formed as shown in FIG. 15. The waveguide is removed for a length of approximately 15 μm at the emission area in front of the EAM part, and the removed area is imbedded by imbed growth to form an imbedded window. Both sides of the waveguide ridge are imbed-grown with an Fe-doped semi-insulating InP layer 30 approximately 2.5 μm thick, and an n-InP current blocking layer 31 approximately 0.5 μm thick.

To prevent high frequency leakage, the current blocking layer 31 is then etched to a depth of approximately 0.5 μm in an isolation area to separate the n-InP current blocking layer 31 in the EAM part from the current blocking layer 31 in the LD part. Next, an approximately 2.5 μm thick p-InP layer 23c, and an approximately 0.5 μm thick p-InGaAs contact layer 32, are grown as shown in FIG. 18. The p-InGaAs contact layer 32 is then etched and removed from all areas other than in the LD part, EAM part, SOA part, and where contacts are formed.

Figure 20A:
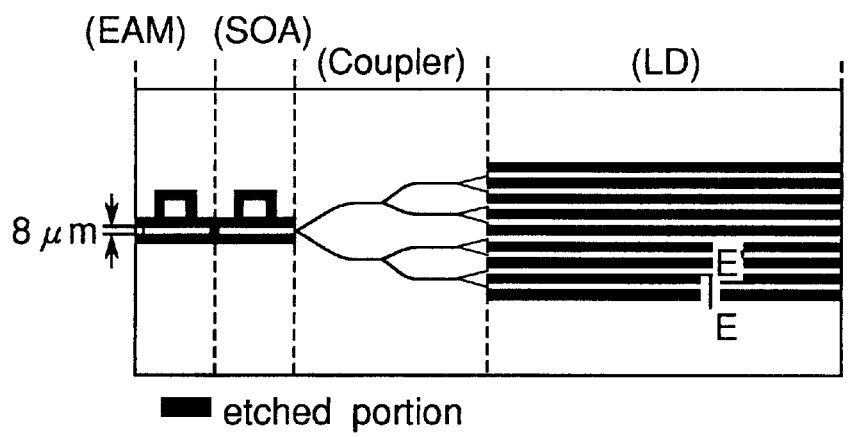
FIGS. 20A and 20B are a plan view and side section view, respectively, of a step in a process for manufacturing the semiconductor laser chip shown in FIG. 1.
Figure 20B:
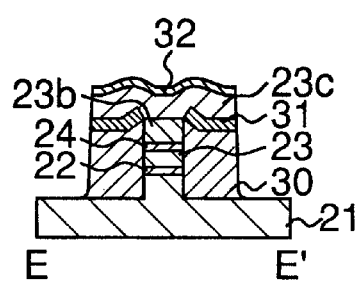
Figure 21A:
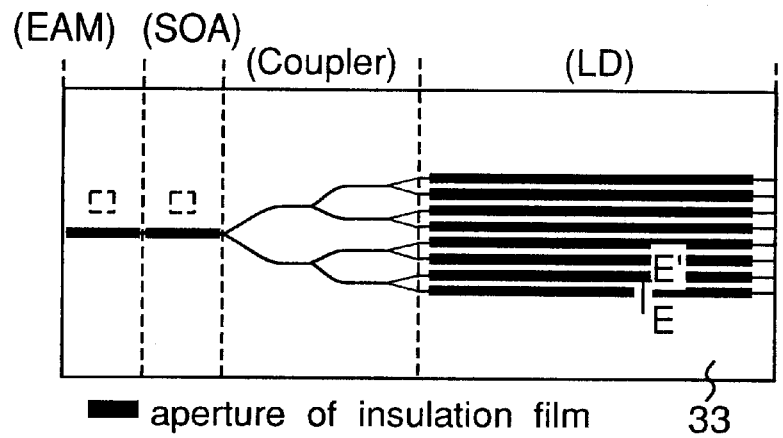
FIGS. 21A and 21B are a plan view and side section view, respectively, of a step in a process for manufacturing the semiconductor laser chip shown in FIG. 1.
Figure 21B:
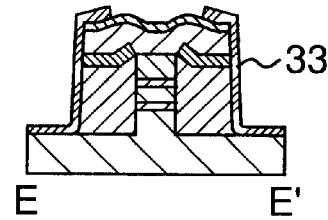
Figure 22A:
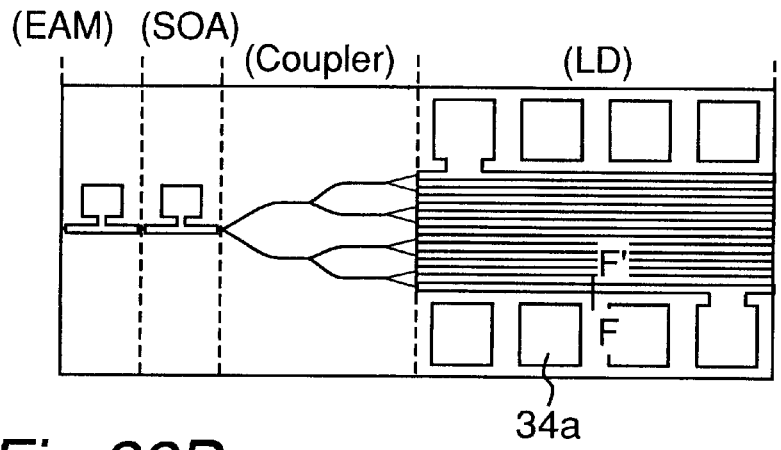
FIGS. 22A and 22B are a plan view and side section view, respectively, of a step in a process for manufacturing the semiconductor laser chip shown in FIG. 1.
Figure 22B:
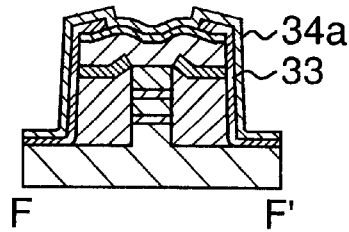

The LD part, EAM part and SOA part are then etched to a depth of approximately 7 μm to obtain a mesa structure approximately 8 μm wide as shown in FIG. 20. The EAM part and SOA part are then etched around where the bonding pads are to be formed to form a mesa. An insulating film 33 is then formed to the entire surface, and openings are formed in the insulating film 33 in the electrode contact areas of the LD part, EAM part, and SOA part as shown in FIG. 21. Contact electrodes 34a are then formed as shown in FIG. 22, and the electrode metal is removed other than where it must be left.

Figure 23A:
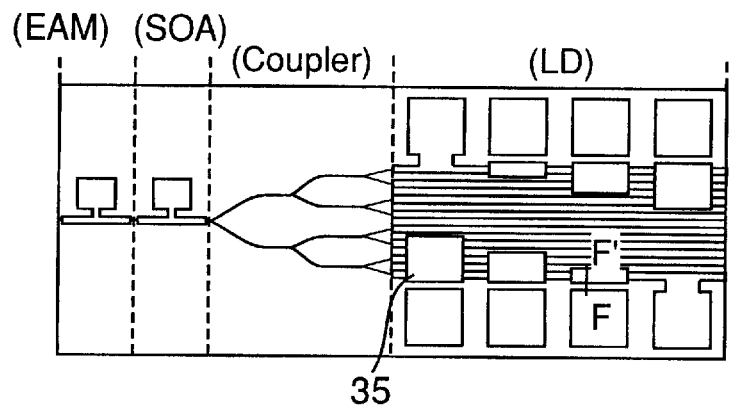
FIGS. 23A and 23B are a plan view and side section view, respectively, of a step in a process for manufacturing the semiconductor laser chip shown in FIG. 1.
Figure 23B:
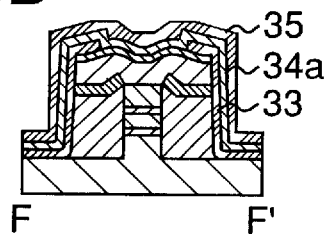
Figure 24A:
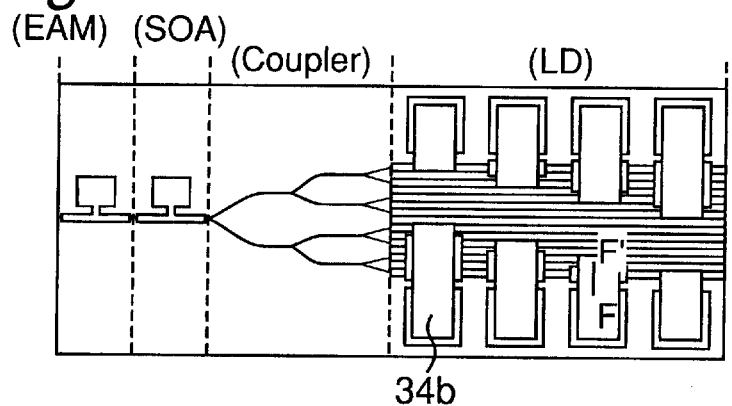
FIGS. 24A and 24B are a plan view and side section view, respectively, of a step in a process for manufacturing the semiconductor laser chip shown in FIG. 1.
Figure 24B:
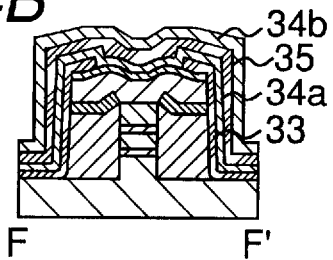
Figure 25:
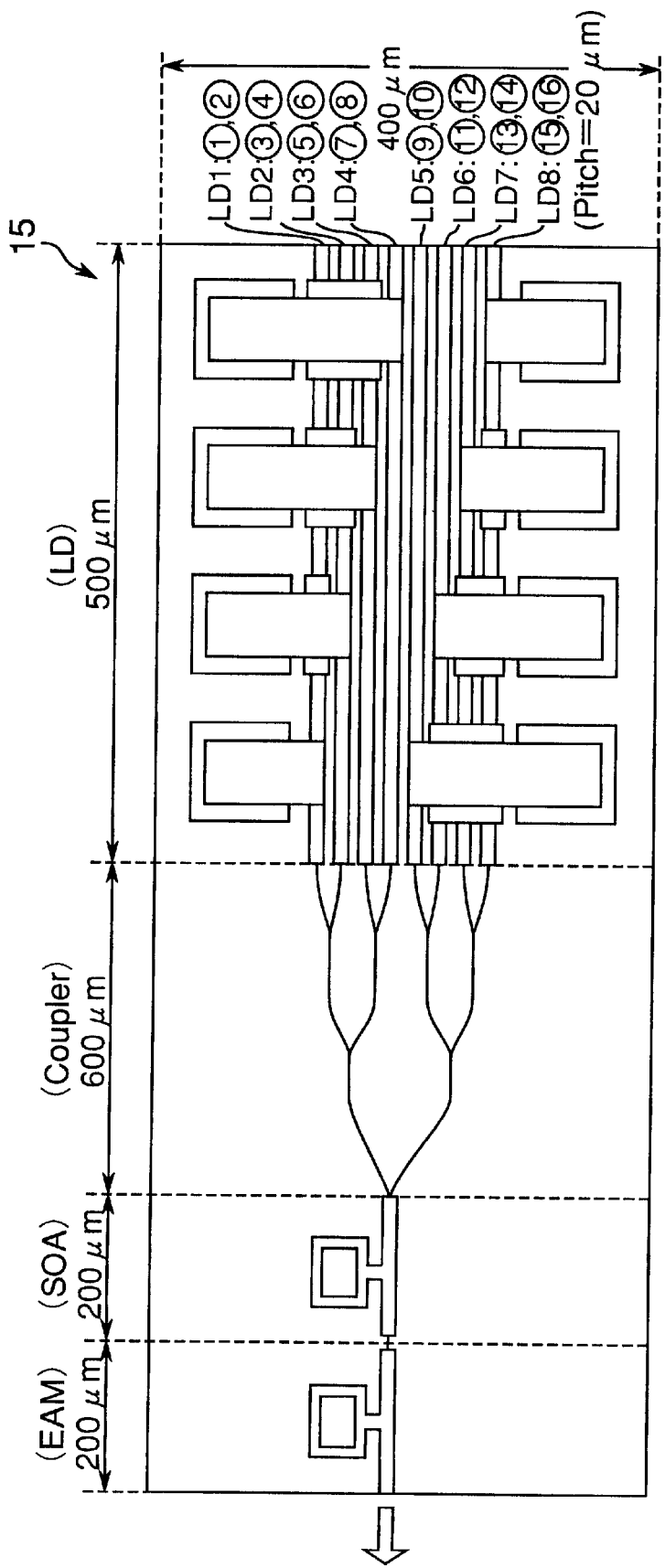
FIG. 25 is a plan view of the semiconductor laser chip shown in FIG. 1.

An insulation film or polyimide layer 35 is then formed as shown in FIG. 23 to enable multi-layer interconnection to the contact electrodes 34a. Finally, as shown in FIG. 24, multi-layer interconnection electrodes 34b are formed between the bonding pads and top of the LD part, the semiconductor substrate 21 is polished to approximately 100 μm thick, and electrodes are formed on the back of the semiconductor substrate 21. The result of this process is a semiconductor laser chip 15 as shown in FIG. 25.

The flow of the operation of an exemplary integrated modulator semiconductor laser 1 is described next below with reference to FIG. 26. It is to be noted that FIG. 26 more specifically describes the operation of laser selection circuit 2, offset bias control circuit 3, temperature control circuit 4, and control circuit 5.

Figure 26:
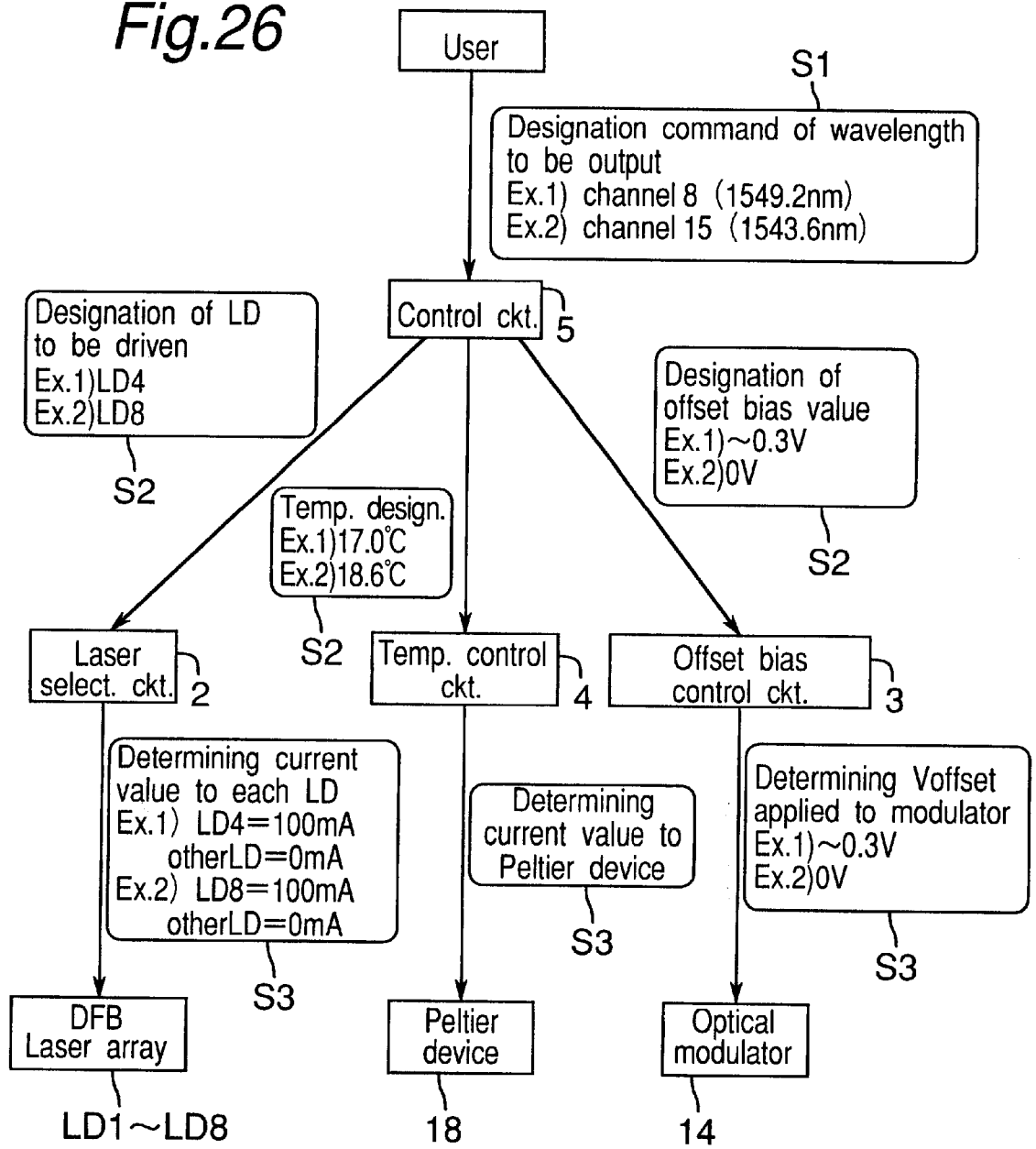
FIG. 26 is a flow diagram used to describe the operation of the semiconductor laser device shown in FIG. 1.

Referring to FIG. 26, a wavelength selection command indicative of the wavelength to be output is input to the control circuit 5 from an external source in step S1. In a first example this command tells the control circuit 5 to select channel 8 for a wavelength of 1549.2 nm; in a second example channel 15 is specified for a 1543.6 nm wavelength.

Based on this command, the control circuit 5 specifies for the laser selection circuit 2 the DFB laser that the laser selection circuit 2 is to supply current to and drive (step S2). In the first example the control circuit 5 specifies LD4; in the second example, LD8. The control circuit 5 also specifies for the offset bias control circuit 3 whether an offset bias is to be applied (step S2). In the first example a specified offset bias voltage Voffset>0 is applied; in the second, Voffset=0. The control circuit 5 also specifies the temperature for temperature control circuit 4 (17.0° C. in example 1; 18.6° C. in example 2)(step S2).

Next, the laser selection circuit 2 determines the current flow to each DFB laser diode LD1 to LD8 (100 mA to LD4 and 0 mA to all others in example 1; 100 mA to LD8 and 0 mA to all others in example 2), and then passes said current to the appropriate laser diode. The offset bias control circuit 3 applies the offset bias voltage Voffset to the optical modulator 14 as instructed by the control circuit 5. The temperature control circuit 4 also determines the current flow to the Peltier cooler 18 to achieve the specified semiconductor laser chip 15 temperature, and then supplies this current to the Peltier cooler 18. (step S3)

It is to be noted that while the semiconductor laser device 10 according to this first preferred embodiment of the present invention is described by way of example using DFB lasers for eight different wavelengths, the present invention shall not be so limited and can be applied to a semiconductor laser device using some plurality of DFB lasers of different wavelengths.

Furthermore, this first embodiment has been described using an optical amplifier 13, but the invention shall not be so limited. For example, laser light can be input from the coupler 12 to the optical modulator 14 without passing an intervening optical amplifier 13.

In this first preferred embodiment the semiconductor laser chip has been formed by monolithic integration, but can alternatively be formed by means of hybrid integration packing on a single substrate the DFB lasers, coupler, and optical modulator, as well as a semiconductor optical amplifier as desired.

Figure 27:
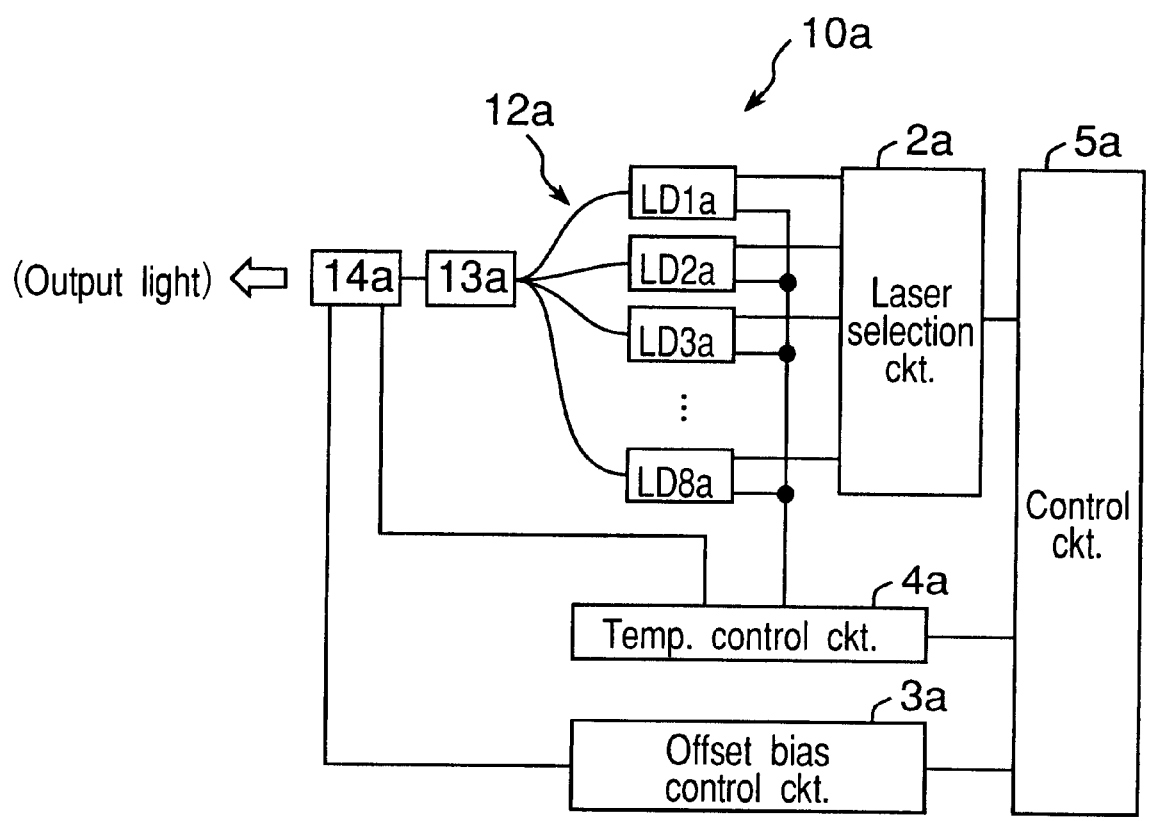
FIG. 27 is a block diagram of an alternative version of the semiconductor laser device shown in FIG. 1.

It is yet further possible to provide the DFB lasers, coupler, optical modulator, and semiconductor optical amplifier as desired, as discrete modules instead of integrated devices. FIG. 27 is a block diagram of a typical configuration using such discrete modules.

The semiconductor laser device 10a shown in FIG. 27 comprises a plurality of single-wavelength DFB laser modules LD1a to LD8a operating at different oscillation wavelengths; a coupler 12a such as an optical fiber coupler for performing the function of coupler 12 shown in FIG. 1; a semiconductor optical amplifier module 13a such as an optical fiber amplifier for amplifying laser light input by way of coupler 12a; and a single electroabsorption modulator module 14a performing the function of optical modulator 14 in FIG. 1. The DFB laser modules LD1a to LD8a, coupler 12a, optical amplifier module 13a, and single electroabsorption modulator module 14a can constitute an optical transmitter. It is also to be noted that like the optical amplifier 13 in FIG. 1, the optical amplifier module 13a can be eliminated as desired.

Semiconductor laser device 10a further comprises laser selection circuit 2a for selecting and supplying power to one of the plural DFB laser modules LD1a to LD8a; an offset bias control circuit 3a for controlling the offset bias applied to the single electroabsorption modulator module 14a; a temperature control circuit 4a for controlling the temperature of DFB laser modules LD1a to LD8a and single electroabsorption modulator module 14a; and a control circuit 5a for controlling operation of laser selection circuit 2a, offset bias control circuit 3a, and temperature control circuit 4a. It should be further noted that each of the DFB laser modules LD1a to LD8a and the single electroabsorption modulator module 14a also have a temperature adjustment means, which is controlled by the temperature control circuit 4a.

A semiconductor laser device 10a thus comprised achieves the same effects as the semiconductor laser device 10 shown in FIG. 1, and can be used to build an optical communications system using an optical transmitter.

It will thus be known from the above that a semiconductor laser device according to a first embodiment of the present invention applies an offset bias to the optical modulator 14 and controls the temperature of the semiconductor laser chip 15 so that the wavelength difference Δλ between the band gap wavelength of the optical modulator 14 and each oscillation wavelength of the multiple DFB laser diodes LD1 to LD8 remains constant. It is therefore possible for a single optical modulator to modulate in a single state light beams of various wavelengths selected from a wide wavelength range of, for example, 12 nm or greater. It is also possible to apply this semiconductor laser device in an optical communications system using an optical transmitter.

Embodiment 2

As described above, a semiconductor laser device according to the first embodiment of the present invention uses a plurality of single-wavelength DFB lasers. It is alternatively possible, however, to use a variable oscillation wavelength single-wavelength DFB laser as described below according to a second embodiment of the present invention.

Figure 28:
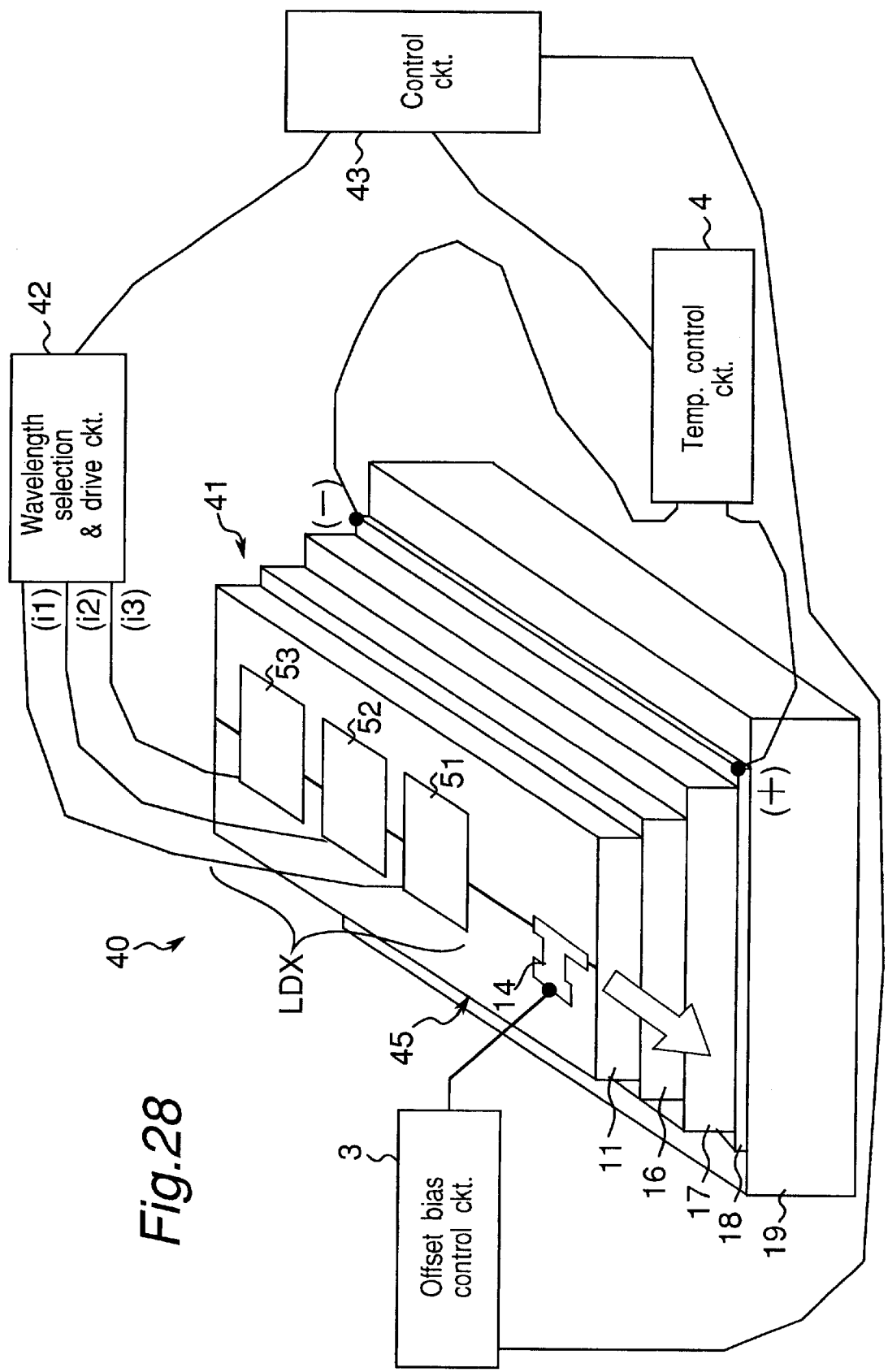
FIG. 28 shows a typical configuration of a semiconductor laser device according to a second preferred embodiment of the present invention.

FIG. 28 is a typical view of a semiconductor laser device according to this second preferred embodiment of the present invention. It is to be noted that like parts in FIG. 28 and FIG. 1 are identified by like reference numeral, and further description thereof is thus omitted below.

As shown in FIG. 28 this exemplary semiconductor laser device 40 comprises an integrated modulator semiconductor laser 41, wavelength selection and drive circuit 42, offset bias control circuit 3, temperature control circuit 4, and control circuit 43 for controlling wavelength selection and drive circuit 42, offset bias control circuit 3, and temperature control circuit 4. The integrated modulator semiconductor laser 41 comprises an optical modulator and a variable single-wavelength DFB laser. The wavelength selection and drive circuit 42 drive controls the DFB laser of the integrated modulator semiconductor laser 41 to oscillate at a desired wavelength.

The integrated modulator semiconductor laser 41 comprises a semiconductor laser chip 45 formed by integrating optical modulator 14 with a variable wavelength laser LDX having a tunable oscillation wavelength on semiconductor substrate 11. A Peltier cooler 18 affixed to metallic package 19 is disposed to the back side of the semiconductor laser chip 45 by way of intervening submount 16 and metal block 17.

The oscillation wavelength of a variable single-wavelength laser LDX can be changed by dividing the electrode into, for example, two to five sections, and varying the current flow to each electrode section. This second embodiment is described using three electrodes by way of example only. Variable wavelength single lasers have been reported from various research institutes, including, for example the NTT Optoelectronics Research Institute in "Oscillation frequency stabilization in a tunable wavelength laser," Technical Report of IEICE, OPE97-151 (1998–02) (in Japanese), and IEEE Photonics Technology Letters, Vol. 7 No. 7, July 1995. Such tunable single-wavelength lasers are thus known from the literature, and further description thereof is omitted below.

In this semiconductor laser device 40, each of electrodes 51 to 53 of variable wavelength single laser LDX is connected to wavelength selection and drive circuit 42, and wavelength selection and drive circuit 42, offset bias control circuit 3, and temperature control circuit 4 are connected to control circuit 43.

In a semiconductor laser device 40 thus comprised, the control circuit 43 specifies for wavelength selection and drive circuit 42 the current flow to each of electrodes 51 to 53 in variable single-wavelength laser LDX, specifies for offset bias control circuit 3 whether there is an offset bias to apply, and specifies a temperature for temperature control circuit 4. This control circuit 43 also makes these decisions according to predefined data for a specified laser wavelength input from an external source. Note that the control circuit 43 controls the offset bias control circuit 3 and temperature control circuit 4 in the same manner as the control circuit 5 shown in FIG. 1, and further description thereof is thus omitted below.

The operation of semiconductor laser device 40 is described next below with reference to FIG. 29 in which an exemplary flow of operation is shown. It should be noted that FIG. 29 more specifically shows the operation of wavelength selection and drive circuit 42, offset bias control circuit 3, temperature control circuit 4, and control circuit 43.

Figure 29:
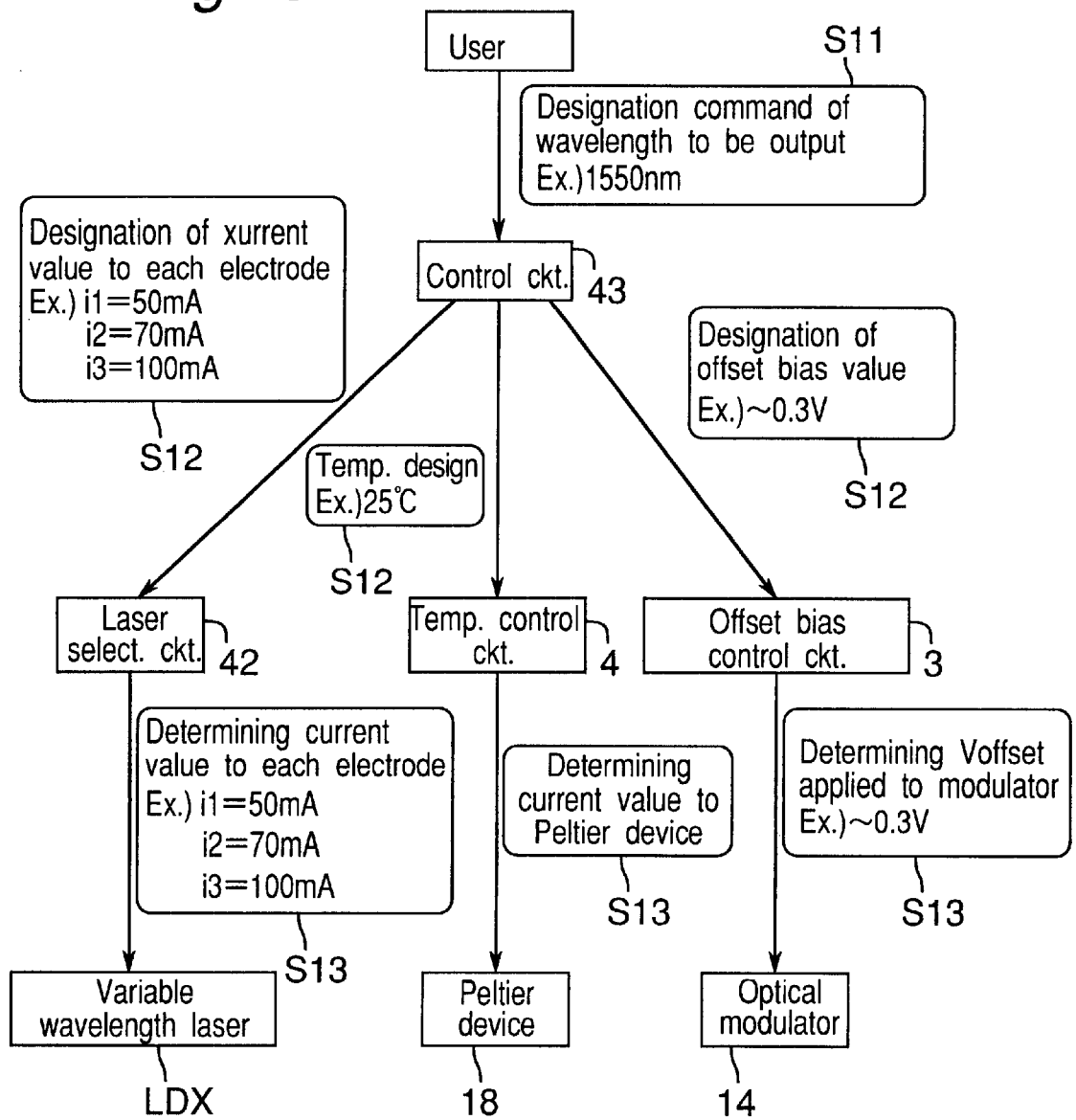
FIG. 29 is a flow diagram used to describe the operation of the semiconductor laser device shown in FIG. 28.

Referring to FIG. 29, a wavelength selection command indicative of the wavelength to be output is received by the control circuit 43 from an external source (step S11). In this example the specified wavelength is 1550 nm.

Based on this specified wavelength, the control circuit 43 specifies for the wavelength selection and drive circuit 42 the current to flow to each of electrodes 51 to 53 in variable single wavelength laser LDX (step S12). In this example current i1 flowing to electrode 51 is 50 mA, current i2 to electrode 52 is 70 mA, and current i3 to electrode 53 is 100 mA. Also in step S12, the control circuit 43 specifies for the offset bias control circuit 3 whether there is an offset bias voltage to apply (a specific Voffset>0, for example), and specifies a temperature (25° C., for example) for the temperature control circuit 4.

Next, in step S13, the wavelength selection and drive circuit 42 supplies the specified current to each of electrodes 51 to 53 in variable single wavelength laser LDX. In addition, the offset bias control circuit 3 applies the specified offset bias voltage Voffset to the optical modulator 14, and the temperature control circuit 4 determines and supplies to the Peltier cooler 18 the current needed to control the semiconductor laser chip 45 to the specified temperature.

It is to be noted that this second preferred embodiment has been described with a configuration not using the optical amplifier 13 shown in FIG. 1. It will also be obvious to one with ordinary skill in the related art, however, that an optical amplifier 13 can be disposed between the variable single wavelength laser LDX and optical modulator 14 similarly to the configuration shown in FIG. 1.

In this second preferred embodiment, too, the semiconductor laser chip has been formed by monolithic integration, but can alternatively be formed by means of hybrid integration packaging on a single substrate the DFB laser and optical modulator, as well as a semiconductor optical amplifier as desired.

Figure 30:
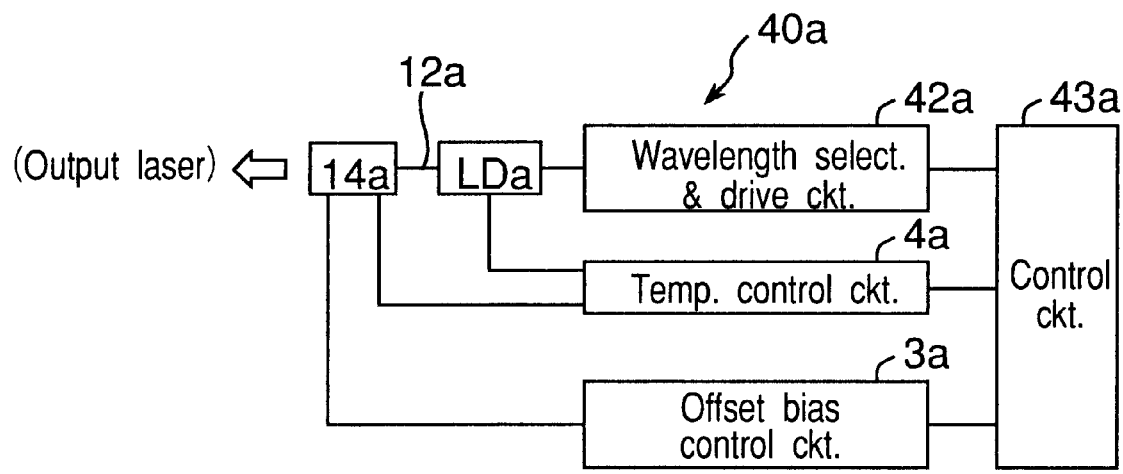
FIG. 30 is a block diagram of an alternative version of the semiconductor laser device shown in FIG. 28.
Figure 31:
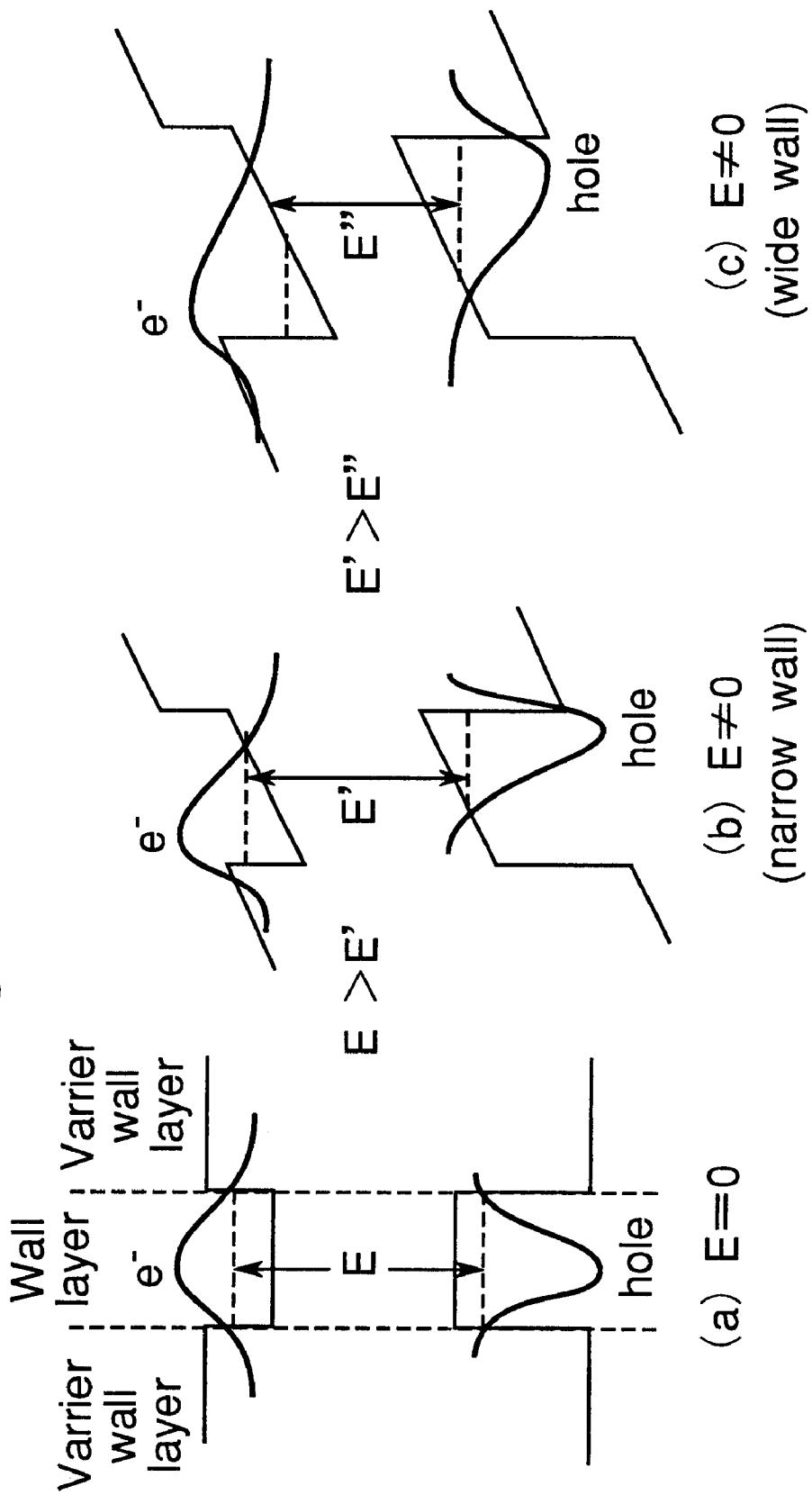
FIGS. 31A to 31C illustrate the quantum trapping Stark effect.
Figure 32:
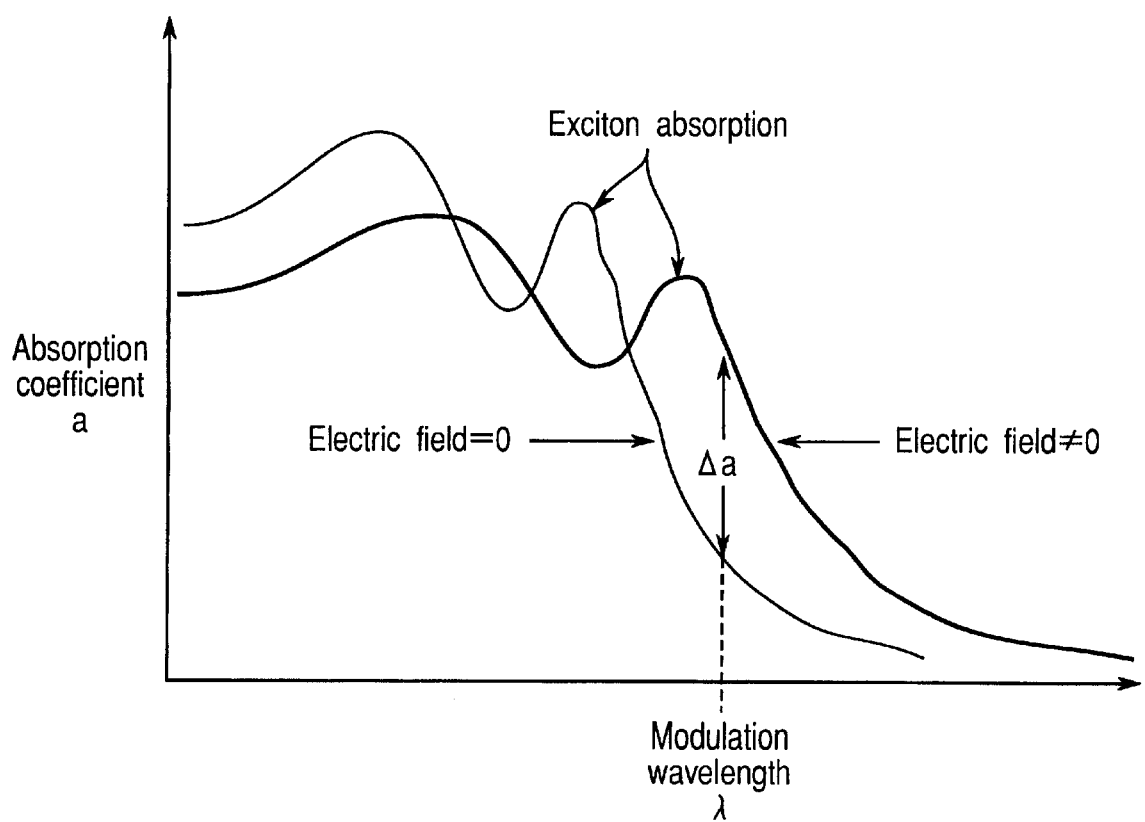
FIG. 32 is used to describe spectrum absorption by a quantum well.
Figure 33:
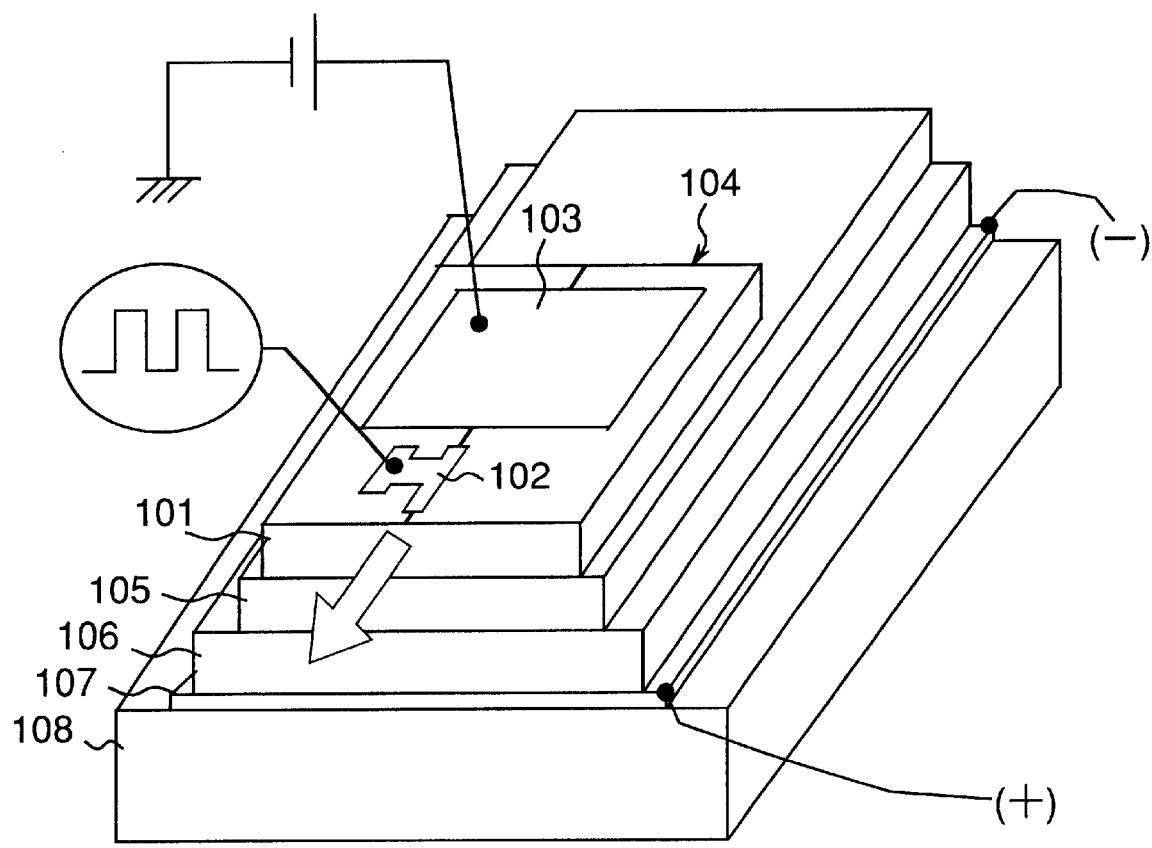
FIG. 33 shows the typical configuration of an integrated modulator semiconductor laser according to the related art.
Figure 34A:
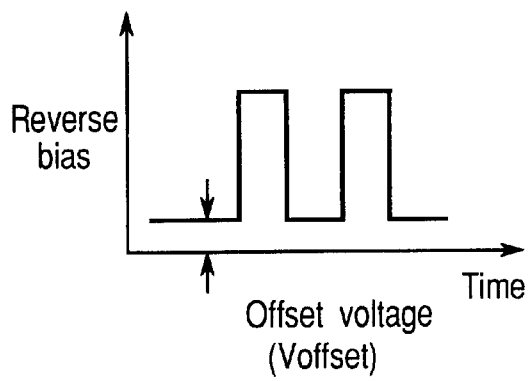
FIGS. 34A and 34B are graphs showing the relationship between offset bias input to the optical modulator in FIG. 33 and the light output from optical modulator.
Figure 34B:
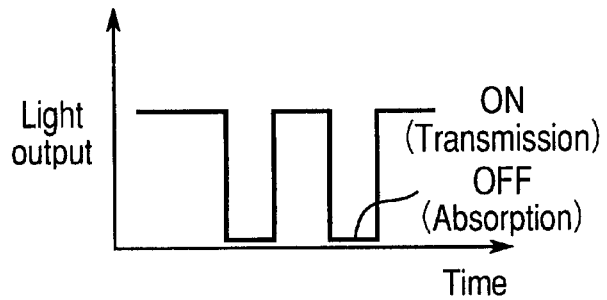
Figure 35:
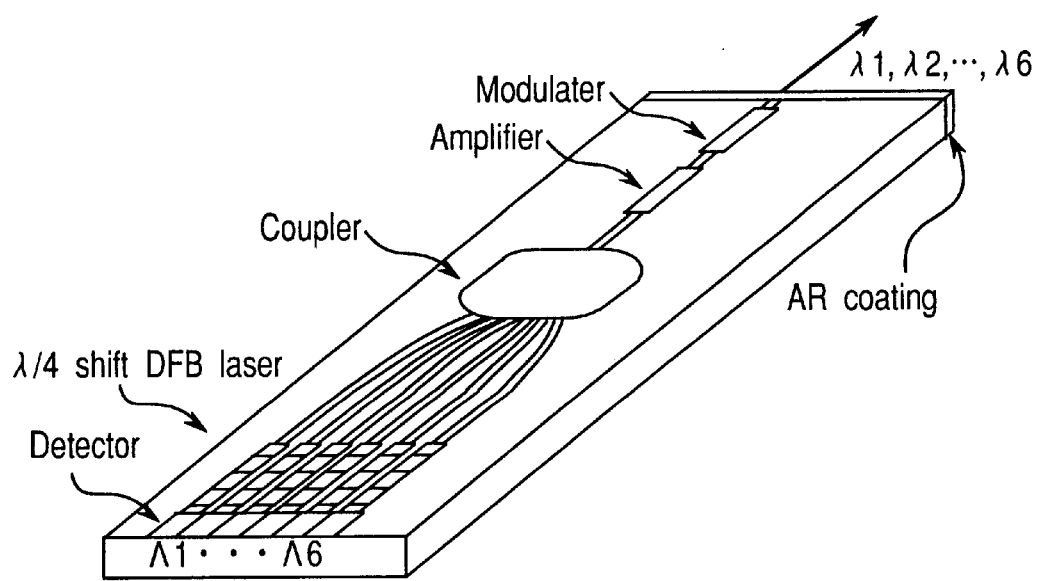
FIG. 35 shows the typical configuration of a semiconductor laser according to the related art.

It is yet further possible to provide the DFB laser and optical modulator, and semiconductor optical amplifier as desired, as discrete modules instead of integrated devices. FIG. 30 is a block diagram of a typical configuration using such discrete modules. It is to be noted that like parts in FIG. 27 and FIG. 30 are identified by like reference numeral.

Referring to FIG. 30, an exemplary semiconductor laser device 40a comprises variable oscillation wavelength DFB laser module LDa, and single electroabsorption modulator module 14a. The variable oscillation wavelength DFB laser module LDa and single electroabsorption modulator module 14a can form an optical transmitter. It will also be obvious that an optical amplifier module 13a can be disposed between DFB laser module LDa and modulator module 14a as desired.

Semiconductor laser device 40a further comprises wavelength selection and drive circuit 42a for driving the DFB laser module LDa to oscillate at a specific wavelength; an offset bias control circuit 3a for controlling the offset bias applied to the single electroabsorption modulator module 14a; a temperature control circuit 4a for controlling the temperature of DFB laser module LDa and single electroabsorption modulator module 14a; and a control circuit 43a for controlling operation of wavelength selection and drive circuit 42a, offset bias control circuit 3a, and temperature control circuit 4a. It should be further noted that DFB laser module LDa and the single electroabsorption modulator module 14a also have a temperature adjustment means, which is controlled by the temperature control circuit 4a.

A semiconductor laser device 40a thus comprised achieves the same effects as the semiconductor laser device 40 shown in FIG. 27, and can be used to build an optical communications system using an optical transmitter.

It will thus be known from the above description that a semiconductor laser device according to this second embodiment of the present invention controls applying an offset bias to the optical modulator 14 and controls the temperature of the semiconductor laser chip 45 so that the wavelength difference $\Delta\lambda$ between the band gap wavelength of the optical modulator 14 and each oscillation wavelength of the variable single-wavelength laser LDX remains constant. It is therefore possible for a single optical modulator to modulate in a single state light beams of various wavelengths selected from a wide wavelength range of 12 nm or greater. It is also possible to apply this semiconductor laser device in an optical communications system using an optical transmitter.

It will also be obvious that while the first and second preferred embodiments of the present invention have been described with reference to a strained MQW structure in the absorption layer of the optical modulator, an MQW structure can be alternatively used.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor laser device comprising:
   a laser unit having a plurality of semiconductor lasers, each laser producing light at a different oscillation wavelength, the oscillation wavelength produced by each semiconductor laser varying with temperature of said semiconductor laser producing the light;
   an optical modulation unit having a single electroabsorption modulator for optically modulating laser light produced by said laser unit in response to an applied principal bias voltage, said electroabsorption modulator having a band gap wavelength varying with voltage applied to said electroabsorption modulator and differing by $\Delta\lambda$ from the oscillation wavelength being produced by one of said semiconductor lasers;
   a coupling unit coupling said laser unit and said optical modulation unit so that laser light from each of said semiconductor lasers is incident on said electroabsorption modulator;
   a temperature control unit for controlling, by heating and cooling, temperature of said laser unit and of said optical modulation unit, said laser device outputting light at at least twice as many oscillation wavelengths as number of semiconductor lasers in said laser unit by selectively controlling the temperature of said laser unit at at least two different controlled temperatures;

a laser selection unit for selecting and operating one of said plurality of semiconductor lasers in said laser unit;

an offset bias control unit for selective application of an offset bias voltage to said electroabsorption modulator of said optical modulation unit for offsetting the principal bias voltage applied to said electroabsorption modulator to adjust the band gap wavelength of said electroabsorption modulator so that a constant $\Delta\lambda$ is maintained for the oscillation wavelength being produced by said semiconductor laser selected and operated by said laser selection unit; and a controller for specifying, for said laser selection unit, the one of said plurality of semiconductor lasers to be operated, based on an external command specifying a wavelength of light to be produced, and for controlling operation of said temperature control unit and said offset bias control unit to maintain the constant wavelength difference $\Delta\lambda$.

2. The semiconductor laser device according to claim 1, wherein said laser unit, said coupling unit, and said optical modulation unit are integrated on a single semiconductor substrate as a semiconductor laser chip, and said temperature control unit controls temperature of said semiconductor laser chip.

3. The semiconductor laser device according to claim 1, wherein said laser unit, said coupling unit, and said optical modulation unit are packaged on a single substrate as a hybrid integrated circuit, and said temperature control unit controls temperature of said hybrid integrated circuit.

4. The semiconductor laser device according to claim 1, wherein said laser unit, said coupling unit, and said optical modulation unit are discrete modules, and said temperature control unit controls temperature of each of said modules.

5. The semiconductor laser device according to claim 1, wherein said electroabsorption modulator of said optical modulation unit has a light absorption layer with a multi-quantum well structure.

6. The semiconductor laser device according to claim 1, wherein said electroabsorption modulator of said optical modulation unit has a light absorption layer with a strained multiquantum well structure.

7. A semiconductor laser device comprising:

a laser unit having a single semiconductor laser including multiple electrodes and selectively oscillating at each of a plurality of different oscillation wavelengths depending upon relative currents supplied to the respective electrodes;

an optical modulation unit having a single electroabsorption modulator for optically modulating laser light produced by said laser unit in response to an applied principal bias voltage, said electroabsorption modulator having a band gap wavelength varying with voltage applied to said electroabsorption modulator and differing by $\Delta\lambda$ from the oscillation wavelength being produced by said semiconductor laser;

a coupling unit coupling said laser unit and said optical modulation unit so that laser light from said laser unit is incident on said electroabsorption modulator;

a temperature control unit for controlling, by heating and cooling, temperature of said laser unit and of said optical modulation unit;

a wavelength selection and drive unit for driving said semiconductor laser of said laser unit at a selected one of the plurality of different wavelengths;

an offset bias control unit for selective application of a selected offset bias voltage, of a plurality of fixed offset bias voltages, to said electroabsorption modulator of said optical modulation unit for offsetting the principal bias voltage applied to said electroabsorption modulator to adjust the band gap wavelength of said electroabsorption modulator so that a constant $\Delta\lambda$ is maintained for oscillation wavelength being produced by said semiconductor laser; and a controller for specifying, for said wavelength selection and drive unit, the selected oscillation wavelength of said semiconductor laser, based on an external command specifying a wavelength of light to be produced, and for controlling operation of said temperature control unit and said offset bias control unit to maintain the constant wavelength difference $\Delta\lambda$.

8. The semiconductor laser device according to claim 7, wherein said laser unit, said coupling unit, and said optical modulation unit are integrated on a single semiconductor substrate as a semiconductor laser chip, and said temperature control unit controls temperature of said semiconductor laser chip.

9. The semiconductor laser device according to claim 7, wherein said laser unit, said coupling unit, and said optical modulation unit are packaged on a single substrate as a hybrid integrated circuit, and said temperature control unit controls temperature of said hybrid integrated circuit.

10. The semiconductor laser device according to claim 7, wherein said laser unit, said coupling unit, and said optical modulation unit are discrete modules, and said temperature control unit controls temperature of each of said modules.

11. The semiconductor laser device according to claim 7, wherein said electroabsorption modulator of said optical modulation unit has a light absorption layer with a multi-quantum well structure.

12. The semiconductor laser device according to claim 7, wherein said electroabsorption modulator of said optical modulation unit has a light absorption layer with a strained multiquantum well structure.

13. A method of driving a semiconductor laser device, the device comprising a laser unit selectively oscillating to produce laser light at a selected one of a plurality of different oscillation wavelengths, an optical modulation unit having a single electroabsorption modulator for optically modulating the laser light produced by the laser unit, in response to an applied principal bias voltage, the electroabsorption modulator having a band gap wavelength varying with voltage applied to the electroabsorption modulator and differing from the oscillation wavelength by $\Delta\lambda$, an offset bias control unit for controlling application of an offset bias to the electroabsorption modulator for offsetting the principal bias voltage applied to the electroabsorption modulator, and a temperature control unit for controlling, by heating and cooling, temperature of the laser unit and of the optical modulation unit, the method comprising:

controlling the temperature of the laser unit and the optical modulation unit in coordination with selectively applying a selected offset bias voltage, of a plurality of fixed offset bias voltages, to the electroabsorption modulator to adjust the band gap wavelength of said electroabsorption modulator so that a constant wavelength difference $\Delta\lambda$, independent of the selected oscillation wavelength, is maintained.

14. The method according to claim 13, wherein the laser unit comprises a plurality of single oscillation wavelength semiconductor lasers, each single oscillation wavelength semiconductor laser producing light of a different oscillation wavelength.

15. The method according to claim 13, wherein the laser unit comprises a single oscillation wavelength semiconductor laser selectively oscillating at each of a plurality of different wavelengths.

* * * * *